US012516445B2

(12) United States Patent
Seo et al.

(10) Patent No.: US 12,516,445 B2
(45) Date of Patent: Jan. 6, 2026

(54) CRUCIBLE AND CRUCIBLE ASSEMBLY, FOR PREPARING CATHODE ACTIVE MATERIAL

(71) Applicant: SM LAB CO., LTD., Ulsan (KR)

(72) Inventors: Min Ho Seo, Gyeonggi-do (KR); Ji Young Kim, Ulsan (KR)

(73) Assignee: SM LAB CO., LTD., Ulsan (KR)

( * ) Notice: Subject to any disclaimer, the term of this patent is extended or adjusted under 35 U.S.C. 154(b) by 249 days.

(21) Appl. No.: 18/274,828

(22) PCT Filed: Feb. 1, 2021

(86) PCT No.: PCT/KR2021/001310

§ 371 (c)(1),
(2) Date: Jul. 28, 2023

(87) PCT Pub. No.: WO2022/163888

PCT Pub. Date: Aug. 4, 2022

(65) Prior Publication Data

US 2024/0110310 A1 Apr. 4, 2024

(51) Int. Cl.
*C30B 35/00* (2006.01)
*C30B 29/22* (2006.01)

(52) U.S. Cl.
CPC ............ *C30B 35/002* (2013.01); *C30B 29/22* (2013.01)

(58) Field of Classification Search
CPC ....... C30B 35/00; C30B 35/002; C30B 29/00; C30B 29/10; C30B 29/22; F27B 14/00; F27B 14/04; F27B 14/08; F27B 14/085; F27B 14/0856; F27B 14/10; F27B 14/102
USPC ................................ 117/200, 204, 937, 944
See application file for complete search history.

(56) References Cited

U.S. PATENT DOCUMENTS

| | | | |
|---|---|---|---|
| 5,935,513 A | 8/1999 | Martreuil et al. |
| 9,534,847 B2 | 1/2017 | Do et al. |
| 2004/0123795 A1 | 7/2004 | Ichizaki |
| 2013/0280667 A1 | 10/2013 | Champaigne et al. |
| 2014/0178827 A1 | 6/2014 | Na et al. |
| 2015/0184311 A1 | 7/2015 | Turenne et al. |

FOREIGN PATENT DOCUMENTS

| | | |
|---|---|---|
| CN | 205 448 703 U | 8/2016 |
| CN | 107 883 774 A | 4/2018 |
| CN | 111 981 856 A | 11/2020 |
| JP | 09315893 A | 10/1994 |
| JP | 2004-002196 A | 1/2004 |
| JP | 2005257171 A * | 9/2005 |

(Continued)

OTHER PUBLICATIONS

English language Abstract of KR1020130117272, published May 30, 2014.

(Continued)

*Primary Examiner* — Kenneth A Bratland, Jr.
(74) *Attorney, Agent, or Firm* — William J. Barber; WARE FRESSOLA MAGUIRE & BARBER LLP

(57) ABSTRACT

The present disclosure provides a crucible assembly for producing a cathode active material. The crucible assembly includes a first crucible having an open top and an internal space and a second crucible disposed below the first crucible and having an incision groove with an open area at an upper portion of each sidewall.

5 Claims, 16 Drawing Sheets

(56) References Cited

FOREIGN PATENT DOCUMENTS

| | | | | |
|---|---|---|---|---|
| JP | 2012201587 | A | | 10/2012 |
| JP | 2015-527287 | A | | 9/2015 |
| KR | 10-1177545 | B1 | | 8/2012 |
| KR | 200 468 934 | Y1 | | 9/2013 |
| KR | 10-2013-0117272 | A | | 10/2013 |
| KR | 101402539 | B1 | * | 5/2014 |
| KR | 1020140082562 | A | | 7/2014 |
| KR | 1020150022997 | A | | 3/2015 |
| KR | 101956559 | B1 | | 3/2019 |
| KR | 10-2021-0000077 | A | | 1/2021 |
| KR | 10-2021-0033343 | A | | 3/2021 |
| WO | 2020179917 | A1 | | 9/2020 |

OTHER PUBLICATIONS

English language Abstract of KR101177545, published Jun. 27, 2012.
English language Abstract of KR1020210000077, published Mar. 18, 2021.
English language Abstract of JP2004002196, published Jan. 8, 2004.
English language Abstract of KR102021003343, published Mar. 30, 2021.
English language Abstract of KR101956559, published Mar. 11, 2019.
English language Abstract of JP09315893, published Oct. 25, 1994.

* cited by examiner

CRUCIBLE AND CRUCIBLE ASSEMBLY, FOR PREPARING CATHODE ACTIVE MATERIAL

TECHNICAL FIELD

The present disclosure relates to a crucible and a crucible assembly for producing a cathode active material.

BACKGROUND ART

Since their commercialized by Sony in 1991, demand for lithium secondary battery has rapidly increased in various fields from small home appliances to medium and large sized electric vehicles and energy storage systems. In particular, a low-cost and high-energy cathode material is essential for medium and large sized electric vehicles and energy storage systems. In this regard, cobalt, which is the main raw material of single-crystal $LiCoO_2$(LCO) and a currently commercialized cathode active material, is expensive.

Therefore, as a cathode active material for medium and large sized secondary batteries, Ni-based cathode active materials indicated as $LiNi_xCo_yMn_zO_2$ (NCM, x+y+z=1) and $LiNi_xCo_yAl_zO_2$ (NCA, x+y+z=1), in which a part of Co is replaced with another transition metal instead of LCO, are used. These NCM and NCA-based cathode active materials include nickel, which is an inexpensive raw material, and thus, have the advantage of low cost and high reversible capacity. In particular, in terms of high capacity, NCM and NCA having a molar ratio of Ni of 50 mol % or more have drawn attention. In general, an Ni-based cathode active material is manufactured by mixing a transition metal compound precursor synthesized by using a coprecipitation method with a lithium source, and then synthesizing the mixture in a solid phase. However, the synthesized Ni-based cathode material exists in the form of secondary particles in which small primary particles are agglomerated, and thus, there is a problem in that micro-cracks are generated inside the secondary particles during a long-term charge/discharge process. These microcracks cause a side reaction between a new interface of the cathode active material and an electrolyte, As a result, battery performance deterioration, such as deterioration in stability due to gas generation and deterioration in battery performance due to exhaustion of electrolyte, may occur. In addition, an increase in the electrode density (>3.3 g/cc) is required to realize high energy density, but this causes a collapse of secondary particles, which leads to electrolyte depletion due to a side reaction with the electrolyte, and thus, a sharp drop in an initial lifespan is caused. In the end, a Ni-based cathode active material in the form of secondary particles synthesized by the conventional coprecipitation method may not be used to achieve high energy density.

In order to solve the problems described above regarding a Ni-based cathode active material in the form of secondary particles, research on a single particle Ni-based cathode active material has been recently conducted. A single-crystal Ni-based cathode active material does not cause collapse of particles when the electrode density is increased (>3.3 g/cc) to achieve high energy density, and thus, high electrochemical performance may be obtained. However, when performing an electrochemical evaluation of such a single-crystal Ni-based cathode active material, a problem has occurred in that the battery stability is deteriorated by structural and/or thermal instability due to unstable $Ni^{3+}$ and $Ni^{4+}$ ions. Therefore, in order to develop a high-energy lithium secondary battery, there is still a need for a technique for stabilizing unstable Ni ions of a single-crystal Ni-based cathode active material.

DISCLOSURE

Technical Problem

An object of the present disclosure is to provide a crucible and a crucible assembly for producing a cathode active material having a single particle shape and high energy density. In addition, an object of the present disclosure is to provide a crucible and a crucible assembly for producing a Ni-based cathode active material having an extended service lifespan. However, these tasks are just illustrative, and the scope of the present disclosure is not limited thereto.

Technical Solution

According to an aspect of the disclosure, a crucible assembly for producing a cathode active material includes a first crucible having an open top and a inner space, and a second crucible disposed under the first crucible and having an incision groove with an open area at an upper portion of each sidewall.

The open area of the incision groove may satisfy the following equation.

$$\frac{A_o}{A_T} \geq 0.05 \quad \text{[Equation]}$$

$A_O$: the open area of an incision groove, and $A_T$: a sidewall area of the second crucible The incision groove may be disposed above a center of a height of the second crucible.

The second crucible may have opposite sidewalls that face each other, and incision grooves on the opposite sidewalls may have disposed to face each other.

At least one of the first crucible and the second crucible may include a compound represented by the following Formula.

$$xAl_2O_3{\cdot}yMgO{\cdot}zSiO_2(0.9<x<1, 0<y<0.1, 0<z<0.1, \text{ and } x+y+z=1) \quad \text{[Formula]}$$

The second crucible may be provided in plurality, and the plurality of the second crucible may be stacked under the first crucible in a height direction.

According to an aspect of the disclosure, a crucible for producing a cathode active material having an inner space defined by a bottom and sidewalls, including an incision groove disposed at an upper portion of each of the sidewalls and each having an open area, the open area of the incision groove follows the following Equation.

$$\frac{A_o}{A_T} \geq 0.05 \quad \text{[Equation]}$$

wherein $A_O$: the open area of incision groove, and $A_T$: a sidewall area of the second crucible.

The crucible may include a compound represented by the following Formula.

$$xAl_2O_3{\cdot}yMgO{\cdot}zSiO_2(0.9<x<1, 0<y<0.1, 0<z<0.1, \text{ and } x+y+z=1) \quad \text{[Formula]}$$

Other aspects, features, and advantages other than those described above will become clear from the detailed description, claims, and drawings for carrying out the invention below.

Advantageous Effects

The crucible and the crucible assembly for producing a cathode active material according to the disclosure may synthesize a single particle cathode active material. Because incision grooves are provided on sidewalls of the crucible, high-temperature heat may be sufficiently introduced into an inner space of the crucible, and thus, single particle cathode active materials may be synthesized.

The crucible and crucible assembly for producing a cathode active material according to the disclosure may mass-produce single particle cathode active materials. A crucible assembly may be formed by stacking crucibles in a height direction, and single particle cathode active materials may be mass-produced in a large amount from the stacked crucibles. In particular, because the open area of the incision groove may be minimized, an amount of cathode active material that may be produced in each crucible may be maximized.

The crucible and crucible assembly for producing a cathode active material according to the disclosure may produce a cathode active material with reduced fine particles of less than 1 μm. By increasing the composition of $Al_2O_3$ in the crucible, it is possible to minimize the amount of fine powder in a synthesized cathode active material, thereby improving the lifetime stability of the cathode active material. Of course, the scope of the present disclosure is not limited by these effects.

MODE FOR INVENTION

Figure 1:
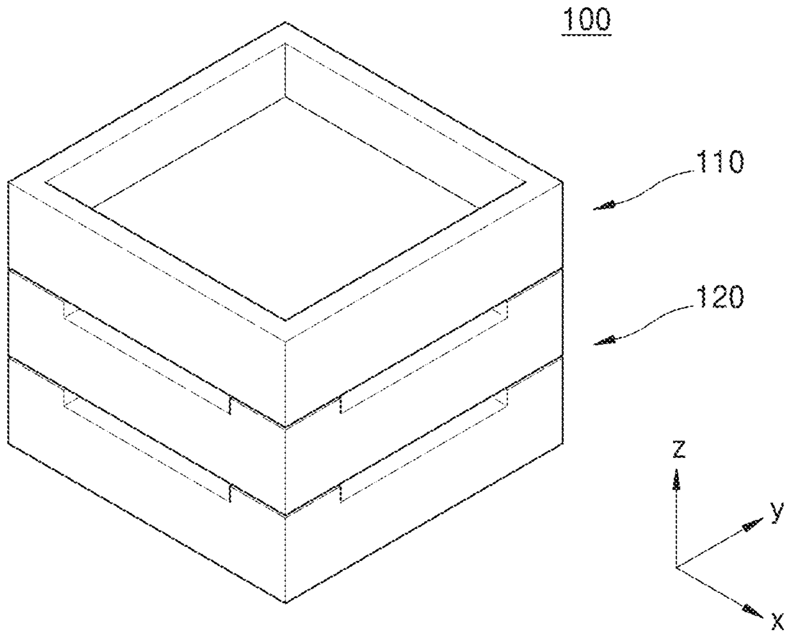
FIG. 1 is a perspective view showing a crucible assembly for producing a cathode active material according to an embodiment.

Hereinafter, various embodiments of the present disclosure will be described with reference to the accompanying drawings. As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope are encompassed in the disclosure. In connection with the description of the drawings, like reference numerals have been used for like elements.

Expressions such as “include” or “may include” used in various embodiments of the present disclosure indicate the presence of disclosed functions, operations, or components, and it does not limit one or more additional functions, operations or components. In addition, in various embodiments of the present disclosure, terms such as “include” or “have” are intended to designate that there are features, numbers, steps, operations, components, parts, or combinations thereof described in the specification, but it should be understood that it does not preclude the possibility of the presence or addition of one or more other features, numbers, steps, operations, components, parts, or combinations thereof.

In various embodiments of the disclosure, expressions such as “or” include any and all combinations of the words listed together. For example, “A or B” may include A, may include B, or may include both A and B.

The terms “the first”, “the second”, “first”, or “second” used in various embodiments of the present disclosure may describe various components of the various embodiments, but these terms do not limit the corresponding components. For example, the above expressions do not limit the order and/or importance of corresponding components. The above terms may be used to distinguish one component from another. For example, the first user device and the second user device are both user devices and represent different user devices. For example, a first element may be termed a second element, and similarly, a second element may also be termed a first element, without departing from the scope of rights of various embodiments of the present disclosure.

When a component is referred to as being “connected” or “contacted” to another component, the component may be directly connected or contacted to the other component, but it should be understood that another new component may exist between the certain component and the other component. On the other hand, when a component is referred to as being “directly connected” or “directly contacted” to another component, it will be understood that no new component exists between the component and the other component.

Terms used in various embodiments of the present disclosure are only used to describe a specific embodiment and are not intended to limit various embodiments of the present disclosure. The singular forms include the plural forms unless the context clearly indicates otherwise.

Unless defined otherwise, all terms used herein, including technical or scientific terms, have the same meaning as commonly understood by one of ordinary skill in the art to which various embodiments of the present disclosure belong.

Terms such as those defined in commonly used dictionaries should be interpreted as having a meaning consistent with the meaning in the context of the related art, and unless explicitly defined in various embodiments of the present disclosure, the terms are not to be construed in an idealized or overly formal sense.

Figure 2:
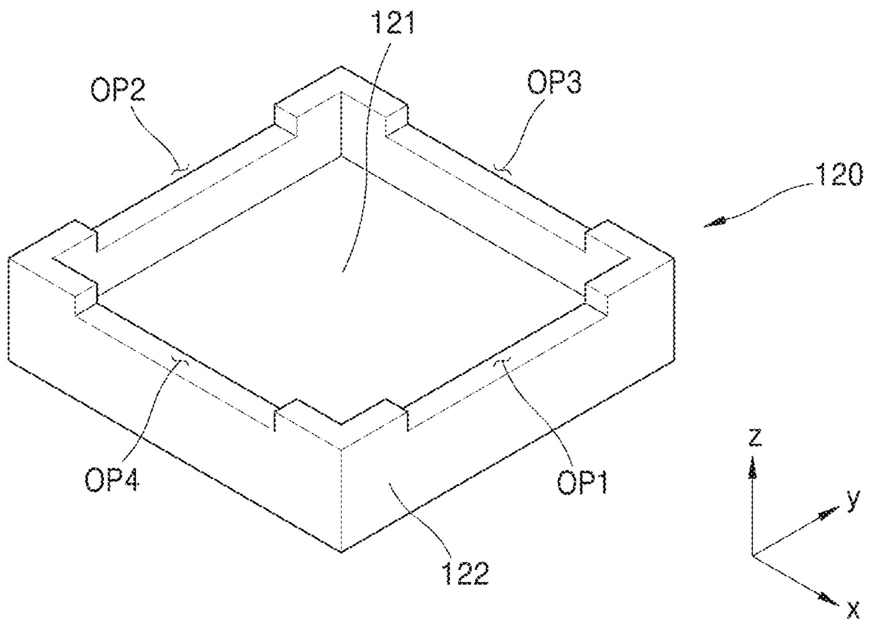
FIG. 2 is a perspective view showing a crucible according to an embodiment.
Figure 3:
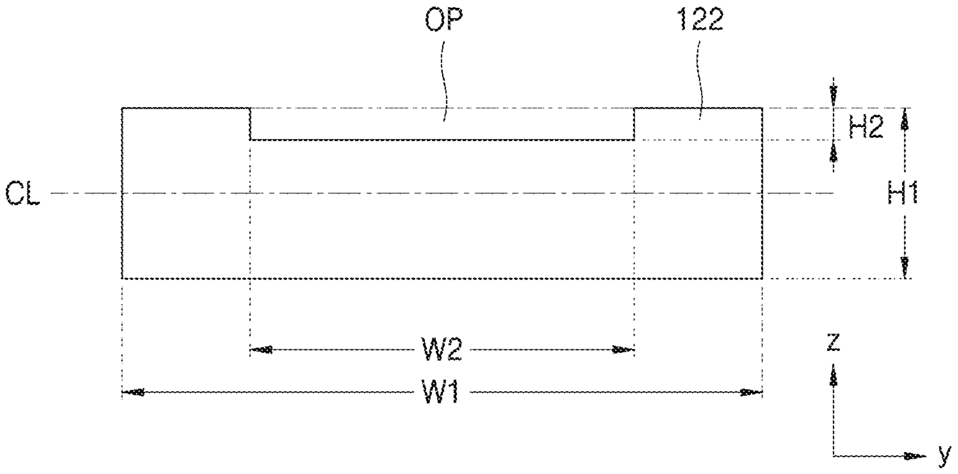
FIG. 3 is a diagram showing one sidewall of the crucible of FIG. 2.
Figure 4:
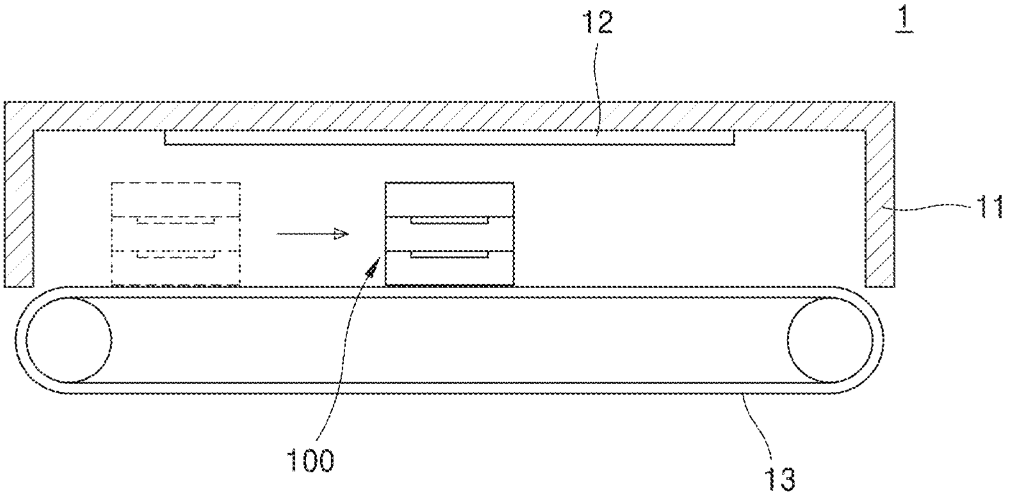
FIG. 4 is a diagram showing an apparatus for producing a cathode active material using the crucible assembly of FIG. 1.

FIG. 1 is a perspective view showing a crucible assembly 100 for producing a cathode active material according to an embodiment, FIG. 2 is a perspective view showing a crucible according to an embodiment, FIG. 3 is a diagram showing one sidewall of the crucible of FIG. 2, and FIG. 4 is a diagram showing an apparatus 1 for producing a cathode active material using the crucible assembly of FIG. 1.

Referring to FIGS. 1 to 4, in the crucible assembly 100 for producing a cathode active material, a plurality of crucibles may be stacked in a height direction. Each of the plurality of crucibles may have a predetermined inner space and may pass through the apparatus 1 for producing a cathode active material.

The apparatus 1 for producing a cathode active material may include a chamber 11 in which a heat source 12 is installed. The chamber 11 may have a rail 13 extending in a length direction thereof and circulating in the length direction. The crucible assembly 100 for producing a cathode active material is installed on the rail 13, and when the crucible assembly 100 moves along the rail 13, a cathode active material is generated in the crucible assembly 100 by heat supplied from the heat source 12.

The crucible assembly 100 for producing a cathode active material may have various shapes having an inner space. For example, the crucible assembly 100 for producing a cathode active material may have a polyhedral or spherical shape. However, in the following description, for convenience of explanation, an embodiment in which each crucible having a substantially hexahedral shape will be mainly described.

The crucible assembly 100 for producing a cathode active material may include a first crucible 110 and a second crucible 120.

The first crucible 110 has an open top and may have a inner space. the inner space of the first crucible 110 may be defined by a bottom and sidewalls of the first crucible 110. The first crucible 110 is disposed on top of the crucible assembly 100 for producing a cathode active material. A material for producing a cathode active material may be stored in the inner space of the first crucible 110. While the crucible assembly 100 for producing a cathode active material passes through the cathode active material producing apparatus 1, the material may be synthesized into a cathode active material.

the bottom and sidewalls of the first crucible 110 are not open, but the top may be open. Because the top of the first crucible 110 is open, the material may receive sufficient heat from the cathode active material producing apparatus 1. Because the first crucible 110 passes through the cathode active material producing apparatus 1 in a state that the top is opened, heat generated in the cathode active material producing apparatus 1 may be directly introduced into the inner space of the first crucible 110.

Because the bottom and sidewalls of the first crucible 110 are closed, sufficient heat for producing a cathode active material may be maintained. When heat is transferred to the first crucible 110, because the compound constituting a bottom and sidewalls retain heat for a long time, a high-quality cathode active material may be produced in the first crucible 110.

The second crucible 120 is disposed below the first crucible 110. The second crucible 120 may include a bottom 121 and sidewalls 122. The top of the second crucible 120 is open like the first crucible 110. The second crucible 120 has a predetermined inner space defined by the bottom 121 and the sidewalls 122, and a material for producing a cathode active material may be stored therein.

The second crucible 120 may have incision grooves OP. Each of the incision grooves OP is disposed at an upper portion of each sidewall 122 and may have an open area. Each of the incision grooves OP is disposed at an upper end of each sidewall 122.

In one embodiment, the incision groove OP may be disposed above the center of a height of the second crucible 120. The incision groove OP may be disposed at the central region of a width of the sidewall 122 of the second crucible 120. Referring to FIG. 3, the incision groove OP may be disposed above the center line CL. Because the incision groove OP is disposed at the upper portion of the sidewall 122, the second crucible 120 may secure a space in which a material for producing a cathode active material may be stored. Because the material may be stored up to the incision groove OP, a large amount of cathode active material may be produced in the second crucible 120.

In one embodiment, the sidewalls of the second crucible 120 may be disposed so that face each other and the second crucible 120 may include a plurality of incision grooves OP on the sidewalls. The incision grooves on the opposite sidewalls may be disposed to face each other. When viewed from a direction perpendicular to one of the opposite sidewalls, the incision grooves on the opposite sidewalls may be overlap each other. Referring to FIG. 2, a first incision groove OP1 and a second incision groove OP2 are disposed to face each other in an x-axis direction, and a third incision groove OP3 and a fourth incision groove OP4 are also disposed to face each other in a y-axis direction. Because the incision grooves OP are disposed to face each other, heat generated in the cathode active material producing apparatus 1 may easily move into the inner space of the second crucible 120.

In one embodiment, an open area of the incision groove OP may be set according to the following Equation.

$$\frac{A_o}{A_T} \geq 0.05 \qquad \text{[Equation]}$$

Figure 5:
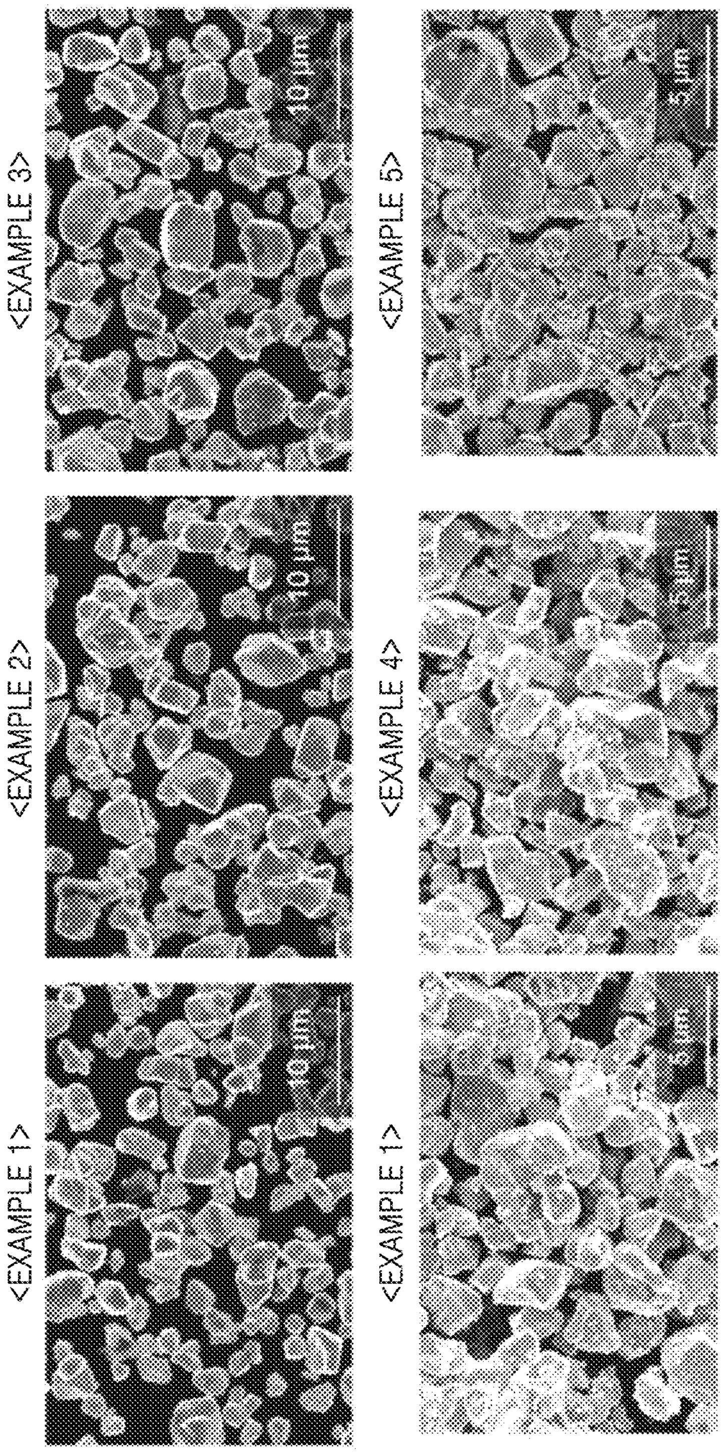
FIG. 5 shows scanning electron microscopy (SEM) images of cathode active materials according to Examples 1 to 5.
Figure 6:
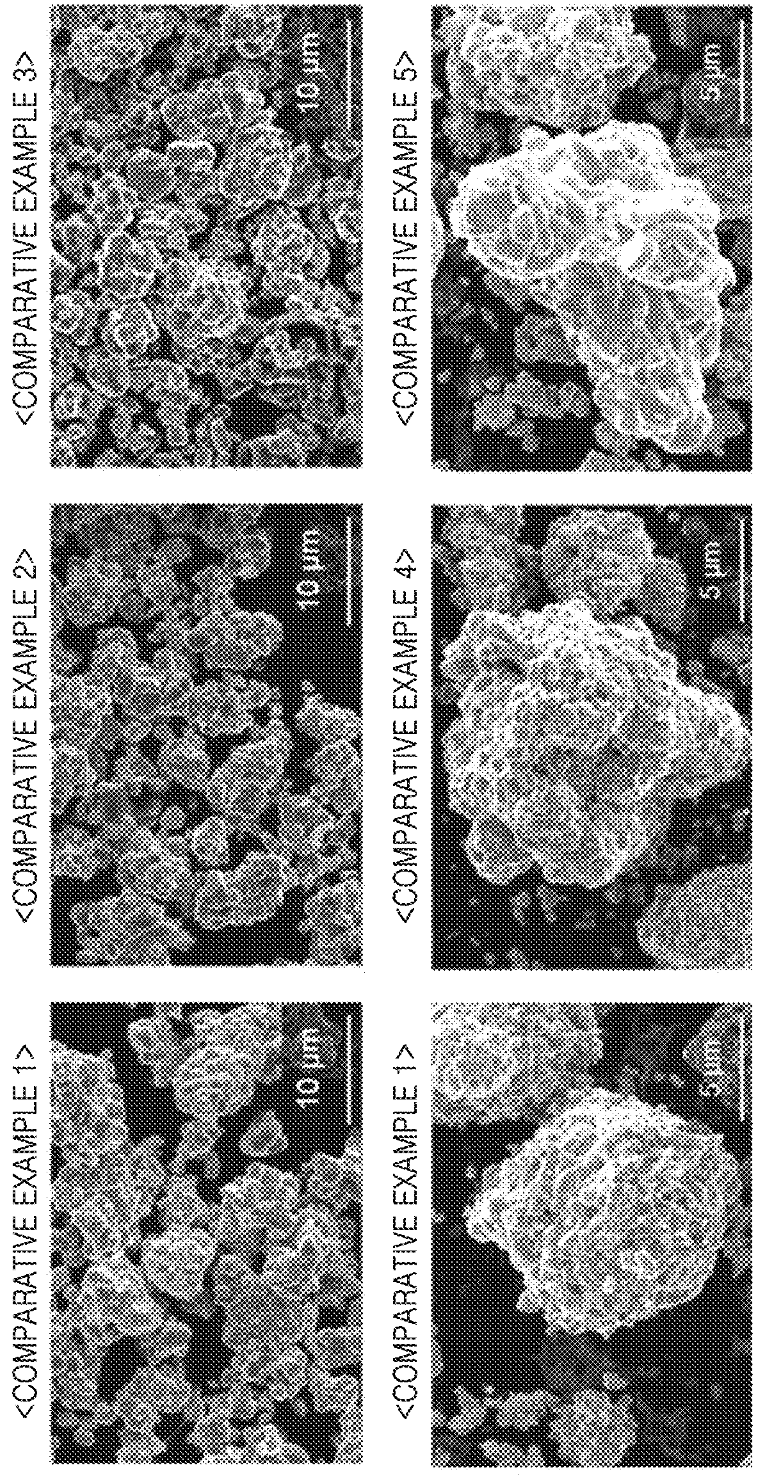
FIG. 6 shows SEM images of cathode active materials according to Comparative Examples 1 to 5.

$A_O$: open area of incision groove, $A_T$: a sidewall area of the second crucible FIG. 5 is a scanning electron microscopy (SEM) image of a cathode active material according to embodiments 1 to 5, and FIG. 6 is a SEM image of a cathode active material according to Comparative Examples 1 to 5.

Referring to FIGS. 5, 6 and Table 1, the cathode active materials synthesized in the crucible assemblies according to embodiments 1 to 5 may be compared.

A crucible assembly was provided by stacking crucibles in three stages, and as shown in FIG. 3, each crucible has a width of W1 (horizontal and vertical length) and a height of H1, and the incision groove has a width of W2 and a height of H2. In each Example and Comparative Example, by adjusting W2 and H2, a ratio ($A_O/A_T$) occupied by an open area of the incision groove in an area of a sidewall is set differently.

rolling is suppressed, and thus, high energy density may be implemented and lifetime deterioration due to breakage of particles may be prevented.

TABLE 1

| | Composition of synthesized cathode active material | W1(mm) | H1(mm) | W2(mm) | H2(mm) | $A_O/A_T$ |
|---|---|---|---|---|---|---|
| Example 1 | $Li_{0.99}Na_{0.01}Ni_{0.795}Co_{0.1}Mn_{0.1}W_{0.01}O_2$ | 300 | 80 | 120 | 10 | 0.05 |
| Example 2 | $Li_{0.99}Na_{0.01}Ni_{0.795}Co_{0.1}Mn_{0.1}W_{0.01}O_2$ | 300 | 80 | 200 | 10 | 0.083 |
| Example 3 | $Li_{0.99}Na_{0.01}Ni_{0.795}Co_{0.15}Al_{0.05}W_{0.01}O_2$ | 300 | 80 | 280 | 10 | 0.117 |
| Example 4 | $Li_{0.99}Na_{0.01}Ni_{0.795}Co_{0.1}Mn_{0.1}W_{0.01}O_2$ | 300 | 80 | 120 | 20 | 0.1 |
| Example 5 | $Li_{0.99}Na_{0.01}Ni_{0.795}Co_{0.15}Al_{0.05}W_{0.01}O_2$ | 300 | 80 | 120 | 25 | 0.125 |
| Comparative Example 1 | $Li_{0.99}Na_{0.01}Ni_{0.795}Co_{0.1}Mn_{0.1}W_{0.01}O_{1.99}S_{0.01}$ | 300 | 80 | 0 | 0 | 0 |
| Comparative Example 2 | $Li_{0.99}Na_{0.01}Ni_{0.795}Co_{0.1}Mn_{0.1}W_{0.01}O_{1.99}S_{0.01}$ | 300 | 80 | 60 | 10 | 0.025 |
| Comparative Example 3 | $Li_{0.99}Na_{0.01}Ni_{0.795}Co_{0.1}Mn_{0.1}W_{0.01}O_{1.99}S_{0.01}$ | 300 | 80 | 100 | 10 | 0.042 |
| Comparative Example 4 | $Li_{0.99}Na_{0.01}Ni_{0.795}Co_{0.1}Mn_{0.1}W_{0.01}O_{1.99}S_{0.01}$ | 300 | 80 | 120 | 5 | 0.025 |
| Comparative Example 5 | $Li_{0.99}Na_{0.01}Ni_{0.795}Co_{0.1}Mn_{0.1}W_{0.01}O_{1.99}S_{0.01}$ | 300 | 80 | 120 | 8 | 0.04 |

In Examples 1 to 5 and Comparative Examples 1 to 5, cathode active materials were synthesized according to the following method. First, 2,000 g of $Ni_{0.8}Co_{0.1}Mn_{0.1}(OH)_2$, 836 g of $Li_2CO_3$, 6 g of $(NH_4)_2HPO_4$, 60 g of $WO_3$, 9 g of NaOH, and 15 g of $(NH_4)_2S$ are mechanically mixed for about 15 minutes. The mixed powder was weighed and placed into the crucible of each Example and Comparative Example, and cathode active materials were obtained through sintering at 1,000° C. for 4 hours and at 700° C. for 10 hours. FIG. 5 shows SEM images according to Examples 1 to 5. As in Examples 1 to 5, it may be confirmed that single particle Ni-based cathode active materials were synthesized in a crucible having a ratio ($A_O/A_T$) of 0.05 or more.

FIG. 6 shows SEM images of Comparative Examples 1 to 5. As in Comparative Examples 1 to 5, multi-particle Ni-based cathode active materials in which small particles having a size of hundreds of nanometers were agglomerated were produced in a crucible having a ratio ($A_O/A_T$) of less than 0.05.

The cathode active material (lithium transition metal oxide) synthesized according to Examples 1 to 5 may be a single particle. A single particle is a term different from a secondary particle formed by aggregating a plurality of particles or a particle (multi-particle) formed by aggregating a plurality of particles and coating of the agglomerate.

In the second crucible 120 according to an embodiment, a single particle cathode active material may be produced by setting a minimum open area $A_O$ of an incision groove with respect to one sidewall area $A_T$. When the ratio of $A_O/A_T$ is 0.05 or more, because a cathode active material synthesized through the crucible assembly 100 has a single particle form, breakage of particles may be prevented even at a high electrode density, and accordingly, high energy density may be implemented and lifetime deterioration due to breakage of particles may be prevented. In addition, because a minimum area occupied by the incision groove OP may be set, the inner space of the second crucible 120 may be maximized, thereby maximizing the amount of single particle cathode active material obtained per one time.

Figure 7:
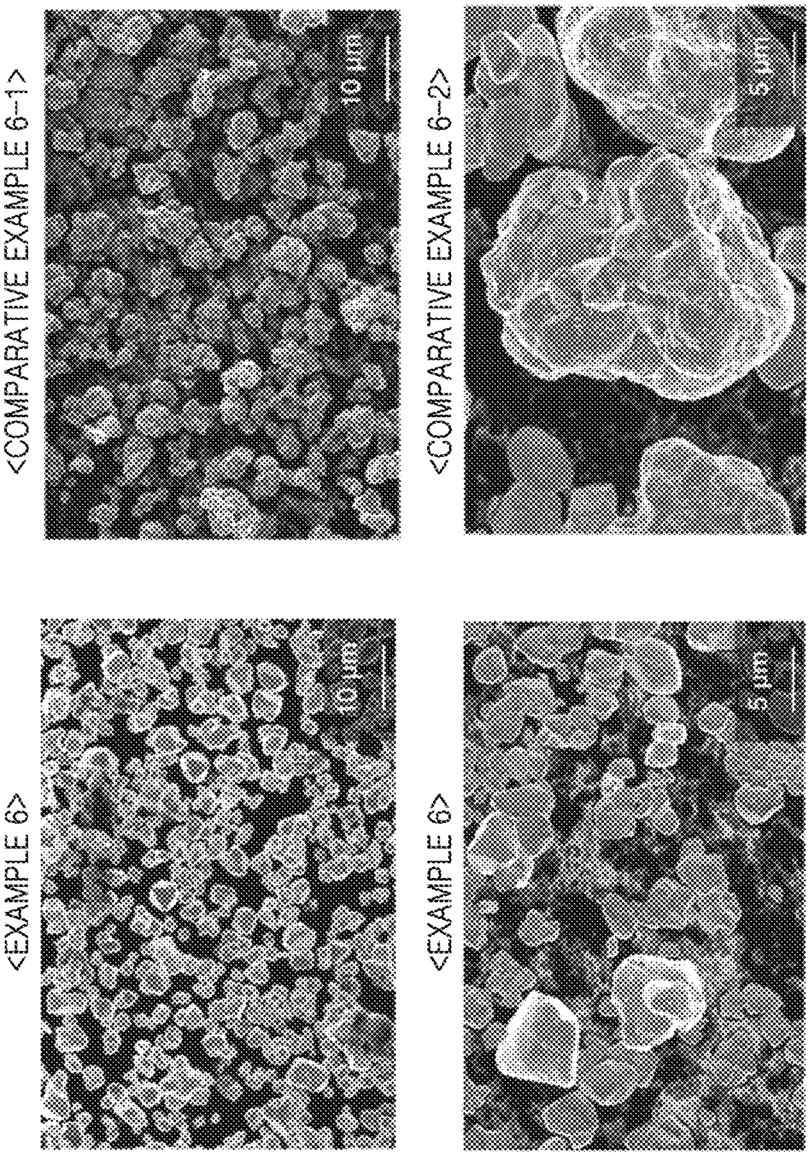
FIG. 7 shows SEM images of cathode active materials according to Example 6, Comparative Example 6-1, and Comparative Example 6-2.

FIG. 7 shows SEM images of the cathode active materials according to Example 6, Comparative Example 6-1, and Comparative Example 6-2.

Referring to FIG. 7 and Table 2, the cathode active materials synthesized in the crucible assemblies according to Example 6, Comparative Example 6-1, and Comparative Example 6-2 may be compared.

A crucible assembly was provided by stacking crucibles in three stages, each crucible has a width of W1 (horizontal and vertical length) and a height of H1, and an incision groove has a width of W2 and a height of H2. In each Example and Comparative Example, by adjusting W2 and H2, a ratio ($A_O/A_T$) occupied by the open area of the incision groove in an area of the sidewall is set differently.

TABLE 2

| | Composition of synthesized cathode active material | W1(mm) | H1(mm) | W2(mm) | H2(mm) | $A_O/A_T$ |
|---|---|---|---|---|---|---|
| Example 6 | $Li_{0.99}Na_{0.01}Ni_{0.795}Co_{0.15}Al_{0.05}W_{0.01}O_2$ | 300 | 80 | 120 | 10 | 0.05 |
| Comparative Example 6-1 | $Li_{0.99}Na_{0.01}Ni_{0.795}Co_{0.1}Mn_{0.1}W_{0.01}O_{1.99}S_{0.01}$ | 300 | 80 | 100 | 10 | 0.0417 |
| Comparative Example 6-2 | $Li_{0.99}Na_{0.01}Ni_{0.795}Co_{0.1}Mn_{0.1}W_{0.01}O_{1.99}S_{0.01}$ | 300 | 80 | 120 | 8 | 0.4 |

Because the lithium transition metal oxide has a single particle shape, particle breakage may be prevented even at a high electrode density. Therefore, it is possible to implement a high energy density of a cathode active material. In addition, compared to a secondary particle in which a plurality of single particles is agglomerated, breakage during In Example 6, Comparative Example 6-1, and Comparative Example 6-2, the cathode active material was synthesized according to the following method. First, 2,000 g of $Ni_{0.9}Co_{0.1}(OH)_2$, 836 g of $Li_2CO_3$, 6 g of $(NH_4)_2HPO_4$, 60 g of $WO_3$, 9 g of NaOH, and 15 g of $(NH_4)_2S$ are mechanically mixed for about 15 minutes. The mixed powder was weighed and placed into each crucible and calcined at 940° C. for 4 hours and 700° C. for 10 hours to obtain a cathode active material. FIG. 7 shows SEM images according to Example 6, Comparative Example 6-1, and Comparative Example 6-2.

As in Example 6, it may be confirmed that a single particle Ni-based cathode active material was synthesized in a crucible having an $A_O/A_T$ of 0.05. However, in the crucibles having a ration ($A_O/A_T$) of less than 0.05 as in Comparative Examples 6-1 and 6-2, multi-particulate Ni-based cathode active materials in which small particles of hundreds of nanometers were agglomerated are produced. Even when $A_O/A_T$ is 0.0417, it may be confirmed that a multi-particulate Ni-based cathode active material is prepared.

Figure 8:
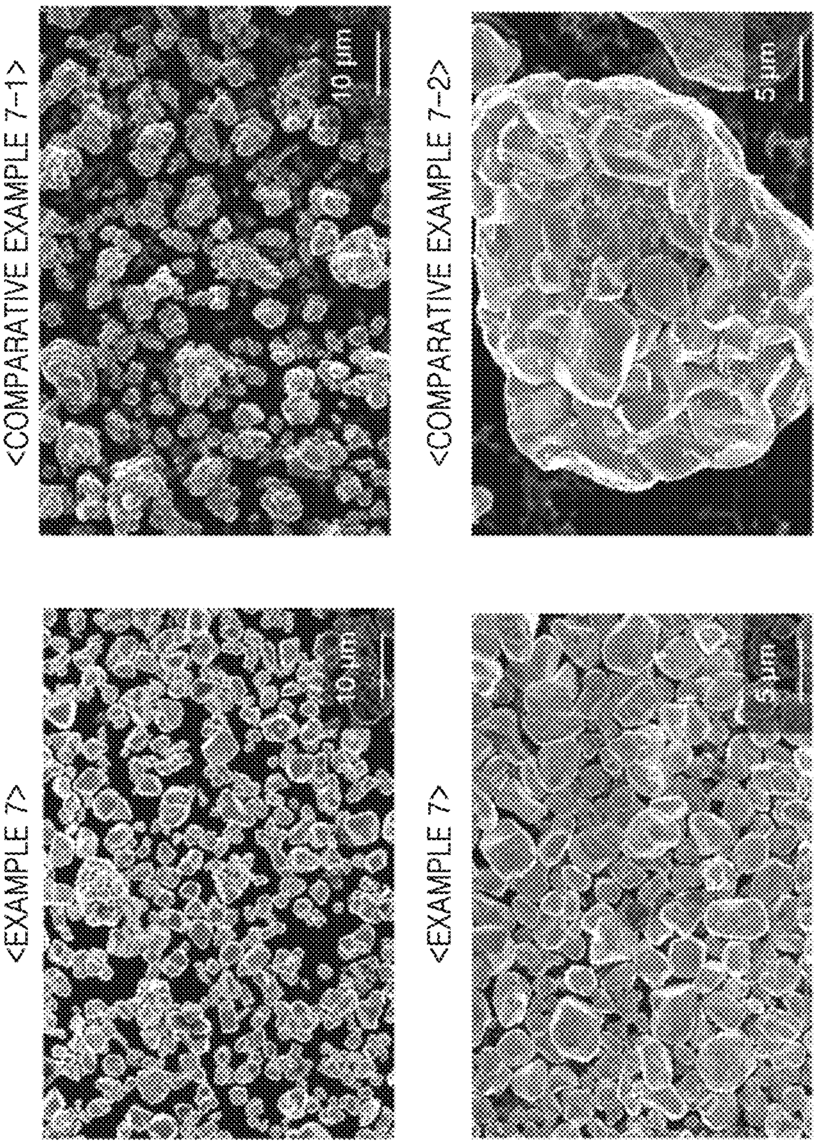
FIG. 8 shows SEM images of the cathode active materials according to Example 7, Comparative Example 7-1, and Comparative Example 7-2.

FIG. 8 shows SEM images of the cathode active materials according to Example 7, Comparative Example 7-1, and Comparative Example 7-2.

Referring to FIG. 8 and Table 3, the cathode active materials synthesized in the crucible assemblies according to Example 7, Comparative Example 7-1, and Comparative Example 7-2 may be compared.

A crucible assembly was provided by stacking crucibles in three stages, each crucible has a width of W1 (horizontal and vertical length) and a height of H1, and the incision groove has a width of W2 and a height of H2. In each Example and Comparative Example, by adjusting W2 and H2, a ratio ($A_O/A_T$) occupied by the open area of the incision groove in an area of the sidewall is set differently.

TABLE 3

| | Composition of synthesized cathode active material | W1(mm) | H1(mm) | W2(mm) | H2(mm) | $A_O/A_T$ |
|---|---|---|---|---|---|---|
| Example 7 | $Li_{0.99}Na_{0.01}Ni_{0.895}Co_{0.10}W_{0.01}O_2$ | 300 | 80 | 120 | 10 | 0.05 |
| Comparative Example 7-1 | $Li_{0.99}Na_{0.01}Ni_{0.795}Co_{0.15}Al_{0.05}W_{0.01}O_{1.99}S_{0.01}$ | 300 | 80 | 100 | 10 | 0.0417 |
| Comparative Example 7-1 | $Li_{0.99}Na_{0.01}Ni_{0.795}Co_{0.15}Al_{0.05}W_{0.01}O_{1.99}S_{0.01}$ | 300 | 80 | 120 | 8 | 0.4 |

In Example 7, Comparative Example 7-1, and Comparative Example 7-2, the cathode active material was synthesized according to the following method. First, 2,000 g of $Ni_{0.88}Co_{0.09}Al_{0.03}(OH)_2$, 836 g of $Li_2CO_3$, 6 g of $(NH_4)_2HPO_4$, 60 g of $WO_3$, 9 g of NaOH, and 15 g of $(NH_4)2_s$ are mechanically mixed for about 15 minutes. The mixed powder was weighed and placed in a crucible and sintered at 1,000° C. for 4 hours and 700° C. for 10 hours to obtain a cathode active material. FIG. 8 shows SEM images of Example 7, Comparative Example 7-1, and Comparative Example 7-2. As in Example 7, in the crucible having a ratio ($A_O/A_T$) of 0.05, it may be confirmed that a single particle Ni-based cathode active material was synthesized. On the other hand, in the crucible having a ratio ($A_O/A_T$) of less than 0.05 as in Comparative Example 7-1 and Comparative Example 7-2, a multi-particulate Ni-based cathode active material in which small particles having a size of hundreds of nanometers were agglomerated was produced. Even when a ratio ($A_O/A_T$) is 0.0417, it may be confirmed that a multi-particulate Ni-based cathode active material is produced.

Figure 9:
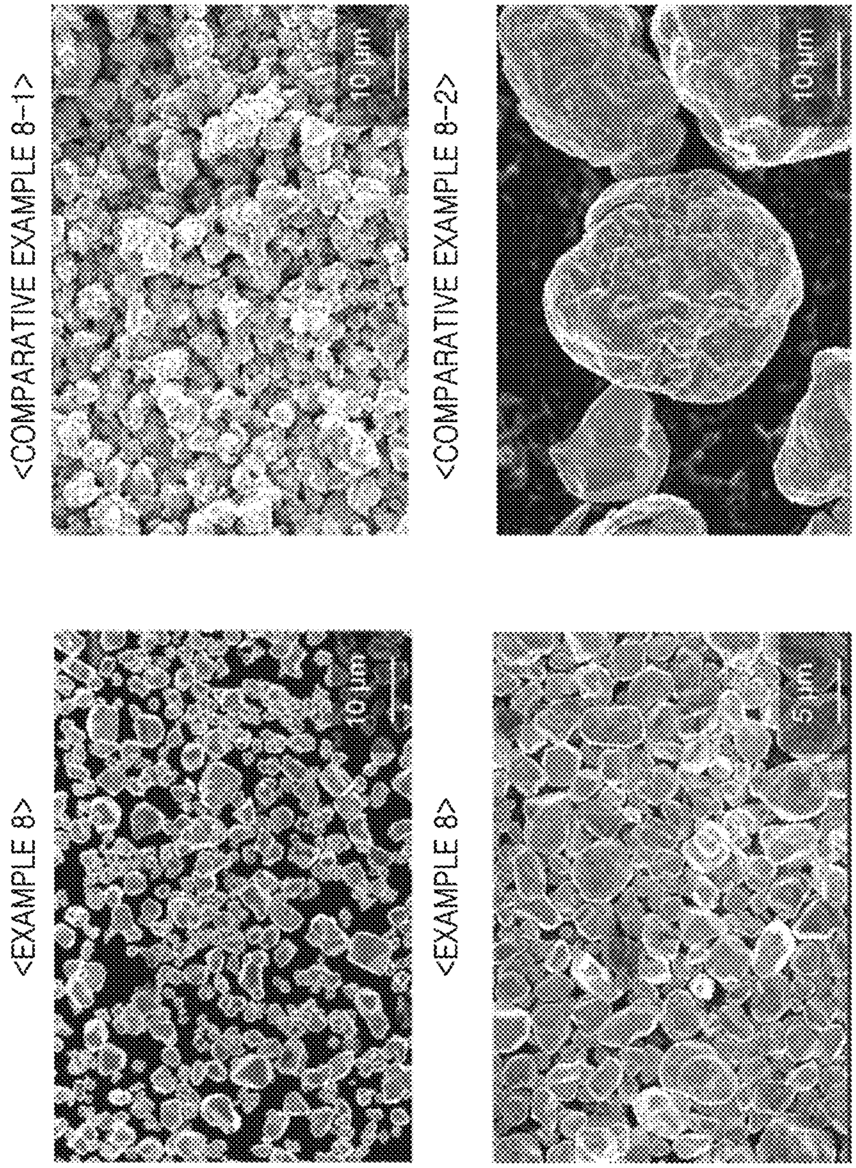
FIG. 9 shows SEM images of the cathode active materials according to Example 8, Comparative Example 8-1, and Comparative Example 8-2.

FIG. 9 shows SEM images of the cathode active materials of Example 8, Comparative Example 8-1, and Comparative Example 8-2.

Referring to FIG. 9 and Table 4, the cathode active materials synthesized in the crucible assemblies according to Example 8, Comparative Example 8-1, and Comparative Example 8-2 may be compared.

A crucible assembly was provided by stacking crucibles in three stages, each crucible has a width of W1 (horizontal and vertical length) and a height of H1, and the incision groove has a width of W2 and a height of H2. In each Example and Comparative Example, by adjusting W2 and H2, a ratio ($A_O/A_T$) occupied by an open area of the incision groove in an area of the sidewall is set differently.

TABLE

| | Composition of synthesized cathode active material | W1(mm) | H1(mm) | W2(mm) | H2(mm) | $A_O/A_T$ |
|---|---|---|---|---|---|---|
| Example 8 | $Li_{0.99}Na_{0.01}Ni_{0.895}Co_{0.10}W_{0.01}O_2$ | 300 | 80 | 120 | 10 | 0.05 |
| Comparative Example 8-1 | $Li_{0.99}Na_{0.01}Ni_{0.895}Co_{0.10}W_{0.01}O_{1.99}S_{0.01}$ | 300 | 80 | 100 | 10 | 0.0417 |
| Comparative Example 8-2 | $Li_{0.99}Na_{0.01}Ni_{0.895}Co_{0.10}W_{0.01}O_{1.99}S_{0.01}$ | 300 | 80 | 120 | 8 | 0.4 |

In Example 8, Comparative Example 8-1, and Comparative Example 8-2, the cathode active material was synthesized according to the following method. First, 2,000 g of $Ni_{0.8}Mn_{0.2}$ $(OH)_2$, 836 g of $Li_2CO_3$, 6 g of $(NH_4)_2HPO_4$, 60 g of $WO_3$, 9 g of NaOH, and 15 g of $(NH_4)2_s$ were mechanically mixed for about 15 minutes. The mixed powder was weighed in a crucible to obtain a cathode active material through sintering at 950° C. for 4 hours and 700° C. for 10 hours. Microscopy (SEM) images are shown. FIG. 9 shows SEM images of Example 8, Comparative Example 8-1, and Comparative Example 8-2. As in Example 8, it may be confirmed that a single particle Ni-based cathode active material was synthesized in a crucible having a ratio ($A_O/A_T$) of 0.05. In contrast, in the crucibles having a ratio ($A_O/A_T$) of less than 0.05 as in Comparative Examples 8-1 and 8-2, multi-particulate Ni-based cathode active materials in which small particles of hundreds of nanometers were agglomerated were produced. Even when the ratio ($A_O/A_T$) is 0.0417, it may be confirmed that a multi-particulate Ni-based cathode active material is produced.

In one embodiment, at least one of the first crucible 110 and the second crucible 120 may include a compound represented by the following Formula. Preferably, the first crucible 110 and the second crucible 120 includes a compound represented by the following formula.

$$xAl_2O_3{\cdot}yMgO{\cdot}zSiO_2(0.9<x<1, 0<y<0.1, 0<z<0.1, \text{ and } x+y+z=1) \quad \text{[Formula]}$$

The components of the crucible for synthesizing the powders of Comparative Examples and Examples are shown in Table 5 below. The crucible specified in Table 5 is composed of a three-component system of $Al_2O_3$, MgO, and $SiO_2$, and crucible A is an industrially commercialized mullite crucible.

Crucible B and crucible C have compositions satisfying the above formula, but crucible A has a composition outside the above formula. Crucible A was used for the synthesis of Comparative examples, and crucibles B and C were used for the synthesis of Examples.

TABLE

| | $Al_2O_3$ (%) | MgO (%) | $SiO_2$(%) |
|---|---|---|---|
| Crucible A | 67.8 | 17.4 | 14.8 |
| Crucible B | 92.5 | 8.4 | 9.1 |
| Crucible C | 97.5 | 1.1 | 1.4 |

Figure 10:
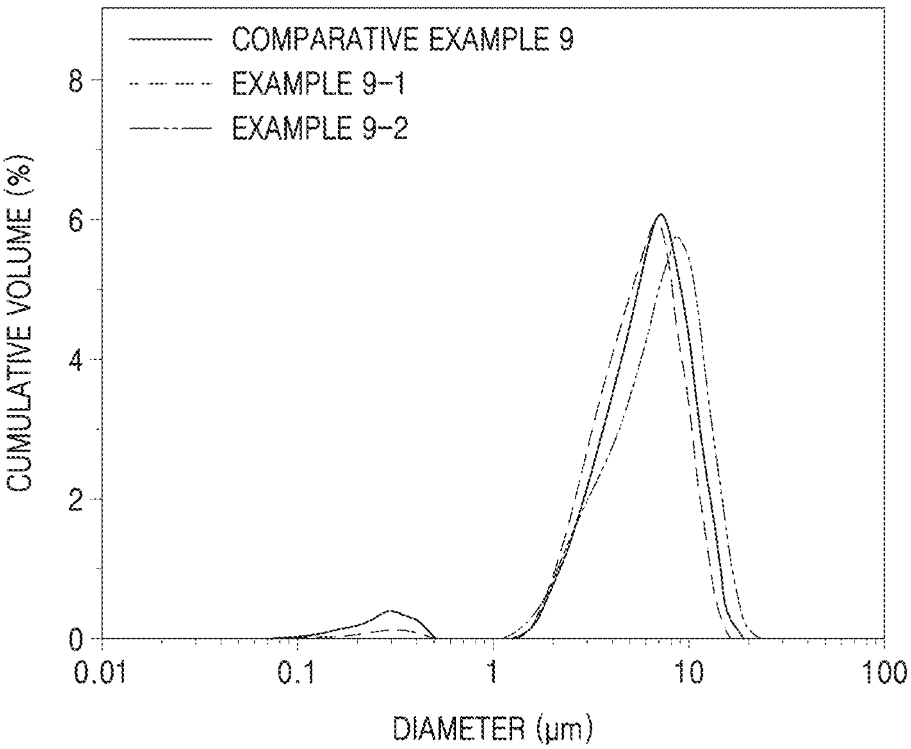
FIG. 10 is a graph showing a particle size distribution of cathode active materials according to Example 9-1, Example 9-2 and Comparative Example 9.

FIG. 10 is a graph showing the particle size distribution of the cathode active materials of Example 9-1, Example 9-2 and Comparative Example 9. In each Example 9-1, Example 9-2, and Comparative Example 9, 100 g of $Ni_{0.8}Co_{0.1}Mn_{0.1}(OH)_2$, 41.8 g of $Li_2CO_3$, 0.30 g of $(NH_4)_2HPO_4$, 3.0 g of $WO_3$, 0.45 g of NaOH, 0.75 g of $(NH_4)2_s$ are mechanically mixed for about 15 minutes. The mixed powder was weighed and placed into crucible A (Comparative Example 9), crucible B (Example 9-1), and crucible C (Example 9-2) and sintered at 1,000° C. for 4 hours and 700° C. for 10 hours to obtain a cathode active material.

FIG. 10 shows a result of particle size distribution of the cathode active materials produced according to Example 9-1, Example 9-2 and Comparative Example 9. Example 9-1, Example 9-2, and Comparative Example 9 are $LiNi_{0.8}Co_{0.1}Mn_{0.1}O_2$(NCM811). It may be seen that, as the composition of $Al_2O_3$ in the crucible increases, the content of fine particles less than 1 μm decreases. Moreover, it may be seen that the average particle diameter ($D_{50}$) of powder also increases as the composition of $Al_2O_3$ in the crucible increases. This is because, among the three components constituting the crucible, $Al_2O_3$ has the highest thermal conductivity, and as the $Al_2O_3$ content in the crucible increases, even when sintered at the same temperature, an average temperature of the crucible is high, and thus, the particles may further grow.

Hereinafter, the fine powder of the cathode active material is defined as having a size less than 1 μm and is generated from the synthesized cathode active material. When an excessive amount of fine powder (1<μm) is formed during the synthesis of the single particle Ni-based cathode active material through sintering at a high temperature, the specific surface area of the cathode active material powder may increase, which may result in deterioration in electrochemical performance.

In particular, unstable Ni ions on a surface of a cathode particle accelerate side reactions in an electrolyte solution during continuous charge/discharge operation and, at the same time, may form an electrochemically inactive phase which deteriorates lifespan thereof. When an electrochemically inactive phase is generated, oxygen is released into a structure of the cathode active material, thereby deteriorating the stability of the cathode active material. Because the structural instability is also related to the specific surface area of the powder, this may denote that it is essential to reduce the specific surface area of the powder through the removal of fine powder (1<μm) to secure long-life stability.

The crucible assembly according to one embodiment includes 90% or more of $Al_2O_3$, and the cathode active material synthesized in the crucible assembly may reduce the content of fine powder of less than 1 μm and reduce the specific surface area of the powder.

Referring to FIG. 10 and Table 6, it may be seen that, as the content of $Al_2O_3$ in the crucible increases, the excess fine powder present on the particle surface is reduced, and the average size of the powder is further increased. As the average size of the powder increases, the specific surface area of the powder may be reduced as shown in Table 7. Comparing the respective specific surface areas, Comparative Example 9 is 0.67 $m^2/g$, Example 9-1 is 0.58 $m^2/g$, and Example 9-2 is 0.35 $m^2/g$. This means that the electrochemical lifespan will be improved through the reduction of the specific surface area of the cathode active material.

TABLE 6

| | Content of fine powder less than 1 μm (vol. %) | $D_{10}$ (μm) | $D_{50}$ (μm) | $D_{90}$ (μm) |
|---|---|---|---|---|
| Comparative Example 9 | 1 | 2.9 | 5.5 | 10.7 |
| Example 9-1 | 0.27 | 2.8 | 5.8 | 10.7 |
| Example 9-2 | 0.03 | 2.7 | 6.5 | 11.2 |

TABLE 7

| | Specific surface area ($m^2/g$) |
|---|---|
| Comparative Example 9 | 0.67 |
| Example 9-1 | 0.58 |
| Example 9-2 | 0.35 |

Figure 11:
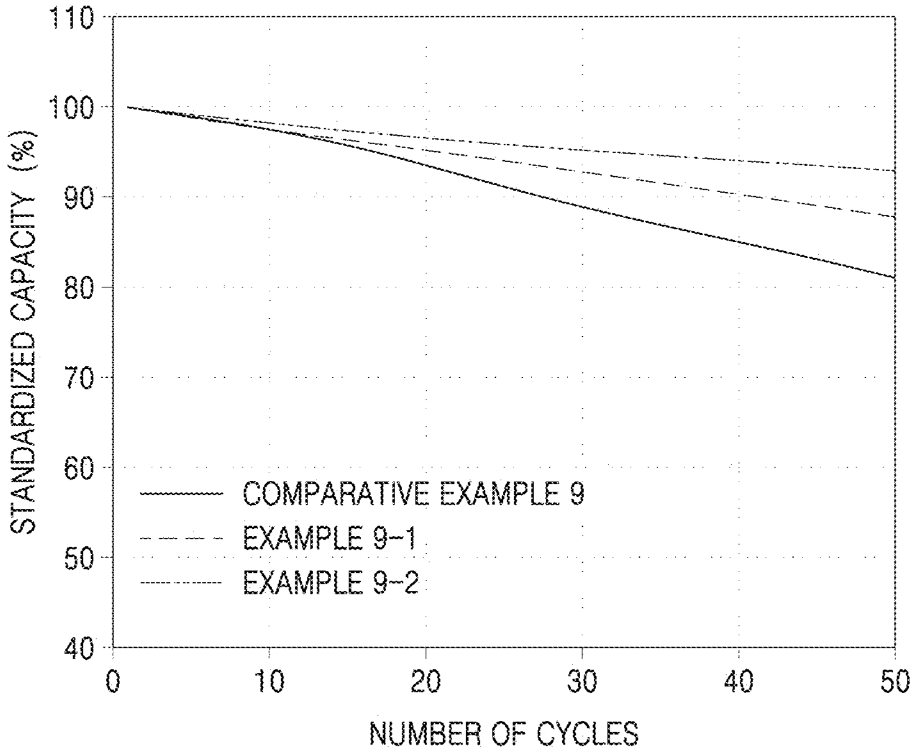
FIG. 11 is a graph of life retention rates for half cells of Example 9-1, Example 9-2, and Comparative Example 9.

FIG. 11 is a graph of life retention rates for half cells of Example 9-1, Example 9-2, and Comparative Example 9. A 2032 R coin type half cell (Welcos) was used for electrochemical evaluation of the Examples, and the composition of a cathode active material electrode plate for a lithium secondary battery includes a cathode active material, a conductive material (Super-P), and a binder (PVdF, KF9300) in a weight ratio of 94:3:3. A loading level of the electrode plate was 11 $mg/cm^2$, and the electrode density was 3.6 g/cc. The electrolyte used was 1.3M LiPF6 ethylene carbonate (EC)/ethyl methyl carbonate (EMC)/dimethyl carbonate (DMC)=3/4/3 (v/v/v).

Electrochemical evaluation of Comparative Example is the same as that of Example. After a 10-hour rest (pause) process for the assembled cell for the initial harmonics evaluation, it was charged in a constant current (CC) mode up to 4.3 V at 0.1 C, and then charged in a CV (constant voltage) mode up to a current equivalent to 0.05 C. Next, discharge was performed in a CC mode up to 3.0V at 0.1 C. To evaluate the lifespan of the half cells at room temperature, after charging up to 4.3V at 0.5 C in CC mode, charging was carried out in CV mode up to a current corresponding to 0.05 C. Next, discharging was performed in CC mode up to 3.0V at 1 C, and this process was repeated a total of 50 times.

The capacity retention rate after charging and discharging 50 times with respect to the initial capacity was calculated, and the results are shown in Table 8 below. In addition, FIG. 11 is a graph showing the capacity retention rate according to cycles.

TABLE 8

| | Composition | Type of crucible | Room temperature life retention rate (%) at 50 cycles |
|---|---|---|---|
| Example 9-1 | $Li_{0.99}Na_{0.01}Ni_{0.795}Co_{0.1}Mn_{0.1}W_{0.01}O_2$ | B | 87.8 |
| Example 9-2 | $Li_{0.99}Na_{0.01}Ni_{0.795}Co_{0.1}Mn_{0.1}W_{0.01}O_2$ | C | 93.1 |
| Comparative Example 9 | $Li_{0.99}Na_{0.01}Ni_{0.795}Co_{0.1}Mn_{0.1}W_{0.01}O_2$ | A | 81.3 |

Figure 12:
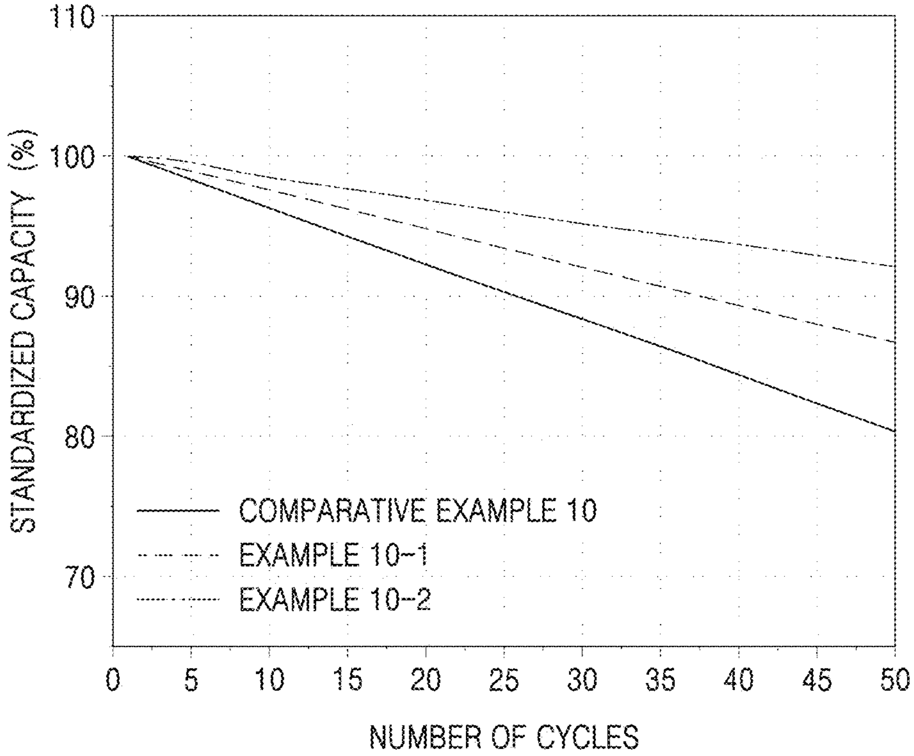
FIG. 12 is a graph of life retention rates for half cells of Examples 10-1, 10-2, and Comparative Example 10.

Referring to Table 8 and FIG. 11, according to results of a room temperature life of Examples 9-1 and 9-2 and Comparative Example 9, Example 9-1 shows a life retention rate higher by about 6% after 50 cycles compared to Comparative Example 9, and Example 9-2 shows a life retention rate higher by about 12% compared to Comparative Example 9. This shows that the life retention rate is improved as the specific surface area of powder is reduced through differential control. FIG. 12 is a graph of life retention rates for half cells of Example 10-1, Example 10-2, and Comparative Example 10.

In each Example 10-1, Example 10-2 and Comparative Example 10, 100 g of $Ni_{0.80}Co_{0.15}Al_{0.05}(OH)_2$, 42.0 g of $Li_2CO_3$, 0.30 g of $(NH_4)_2HPO_4$, 3.0 g of $WO_3$, 0.45 g of NaOH, 0.75 g of $(NH_4)_2S$ are mechanically mixed for about 15 minutes. The mixed powder was weighed and placed into crucible A (Comparative Example 10), crucible B (Example 10-1), and crucible C (Example 10-2) and sintered at 1,000° C. for 4 hours and 700° C. for 10 hours to obtain a cathode active material.

For Example 10-1, Example 10-2, and Comparative Example 10, the capacity retention rate after charging and discharging 50 times was calculated with respect to the initial capacity, respectively, and the results are shown in Table 9 below. In addition, FIG. 12 is a graph showing the capacity retention rate according to cycles.

TABLE 9

| | Composition | Type of crucible | Room temperature life retention rate (%) at 50 cycles |
|---|---|---|---|
| Example 10-1 | $Li_{0.99}Na_{0.01}Ni_{0.795}Co_{0.15}Al_{0.05}W_{0.01}O_2$ | B | 86.8 |
| Example 10-2 | $Li_{0.99}Na_{0.01}Ni_{0.795}Co_{0.15}Al_{0.05}W_{0.01}O_2$ | C | 92.1 |
| Example 10 | $Li_{0.99}Na_{0.01}Ni_{0.795}Co_{0.15}Al_{0.05}W_{0.01}O_2$ | A | 80.4 |

Figure 13:
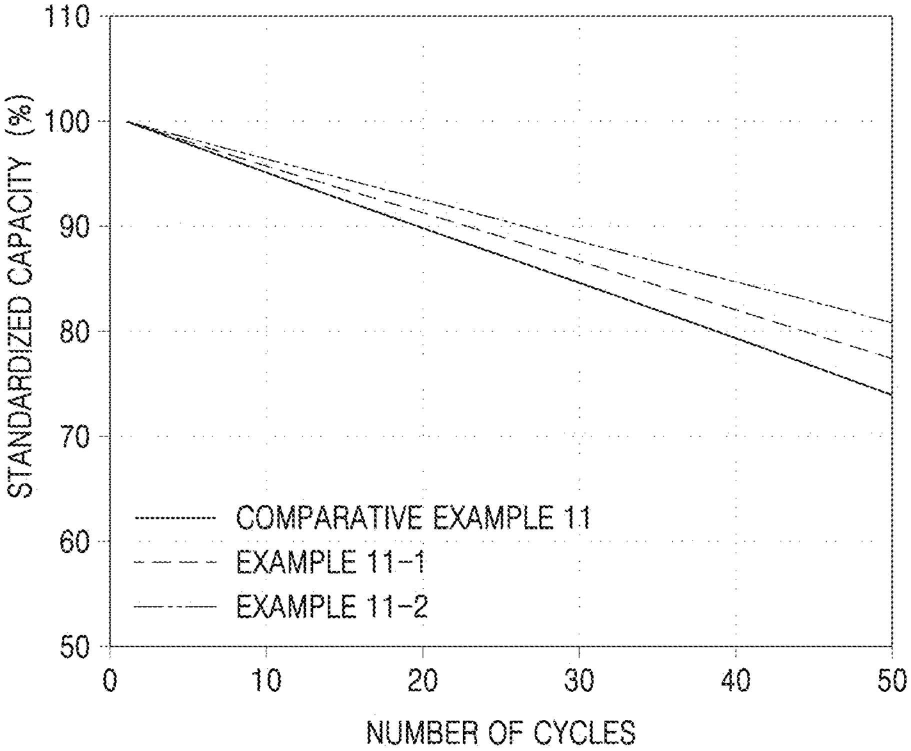
FIG. 13 is a graph of life retention rates for half cells of Examples 11-1, 11-2, and Comparative Example 11.

Referring to Table 9 and FIG. 12, according to the room temperature life results of Example 10-1, Example 10-2 and Comparative Example 10, Example 10-1 shows a life retention rate higher by about 6% compared to Comparative Example 10, and Example 10-2 shows a life retention rate higher by about 12% compared to Comparative Example 10. This shows that the life retention rate is improved as the specific surface area of powder is reduced through differential control. FIG. 13 is a graph of life retention rates for half cells of Example 11-1, Example 11-2, and Comparative Example 11.

In each Example 11-1, Example 11-2 and Comparative Example 11, 100 g of $Ni_{0.90}Co_{0.10}(OH)_2$, 41.5 g of $Li_2CO_3$, 0.30 g of $(NH_4)_2HPO_4$, 3.0 g of $WO_3$, and 0.45 g of NaOH, 0.75 g of $(NH_4)_2S$ are mechanically mixed for about 15 minutes. The mixed powder was weighed and placed into crucible A (Comparative Example 11), crucible B (Example 11-1), and crucible C (Example 11-2) and sintered at 940° C. for 4 hours and 700° C. for 10 hours to obtain a cathode active material.

For each of Example 11-1, Example 11-2 and Comparative Example 11, the capacity retention rate after charging and discharging 50 times was calculated with respect to the initial capacity, and the results are shown in Table 10 below. In addition, FIG. 13 is a graph showing the capacity retention rate according to cycles.

TABLE 10

| | Composition | Type of crucible | Room temperature life retention rate (%) at 50 cycles |
|---|---|---|---|
| Example 11-1 | $Li_{0.99}Na_{0.01}Ni_{0.895}Co_{0.10}W_{0.01}O_2$ | B | 77.1 |
| Example 11-2 | $Li_{0.99}Na_{0.01}Ni_{0.895}Co_{0.10}W_{0.01}O_2$ | C | 80.9 |
| Comparative Example 11 | $Li_{0.99}Na_{0.01}Ni_{0.895}Co_{0.10}W_{0.01}O_2$ | A | 74.0 |

Figure 14:
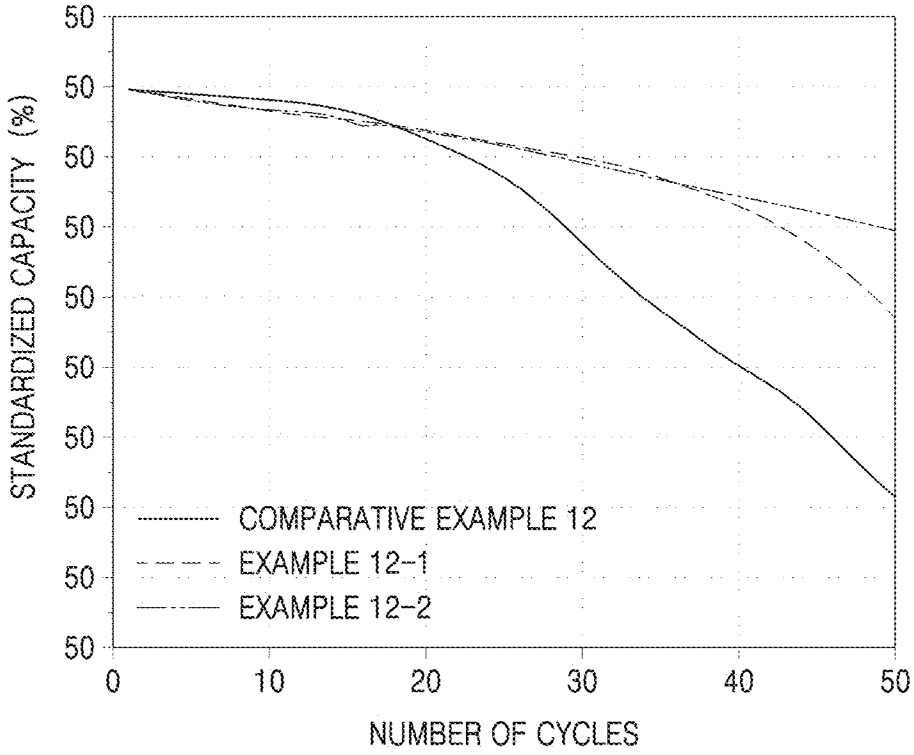
FIG. 14 is a graph of life retention rates for half cells of Examples 12-1, 12-2, and Comparative Example 12.

Referring to Table 10 and FIG. 13, according to the room temperature life results of Example 11-1, Example 11-2 and Comparative Example 11, Example 11-1 shows a life retention rate higher by about 3% compared to Comparative Example 11, and Example 11-2 shows a life retention rate higher by about 7% compared to Comparative Example 11. This shows that the life retention rate is improved as the specific surface area of powder is reduced through differential control. FIG. 14 is a graph of life retention rates for the half cells of Example 12-1, Example 12-2, and Comparative Example 12.

In each of Example 12-1, Example 12-2, and Comparative Example 12, 100 g of $Ni_{0.80}Mn_{0.10}(OH)_2$, 41.3 g of $Li_2CO_3$, 0.30 g of $(NH_4)_2HPO_4$, 3.0 g of $WO_3$, and 0.45 g of NaOH, 0.75 g of $(NH_4)_2S$ are mechanically mixed for about 15 minutes. The mixed powder was weighed and placed into crucible A (Comparative Example 12), crucible B (Example 12-1), and crucible C (Example 12-2) and sintered at 950° C. for 4 hours and 700° C. for 10 hours to obtain a cathode active material was obtained.

For each of Example 12-1, Example 12-2 and Comparative Example 12, the capacity retention rate after charging and discharging 50 times was calculated with respect to the initial capacity, and the results are shown in Table 11 below. In addition, FIG. 14 is a graph showing the capacity retention rate according to cycles.

TABLE 11

| | Composition | Type of crucible | Room temperature life retention rate (%) at 50 cycles |
|---|---|---|---|
| Example 12-1 | $Li_{0.99}Na_{0.01}Ni_{0.795}Mn_{0.20}W_{0.01}O_2$ | B | 83.7 |
| Example 12-2 | $Li_{0.99}Na_{0.01}Ni_{0.795}Mn_{0.20}W_{0.01}O_2$ | C | 90.0 |
| Comparative Example 12 | $Li_{0.99}Na_{0.01}Ni_{0.895}Mn_{0.20}W_{0.01}O_2$ | A | 70.7 |

Referring to Table 11 and FIG. 14, according to the room temperature life results of Example 12-1, Example 12-2, and Comparative Example 12, Example 12-1 shows a life retention rate higher by about 13% compared to Comparative Example 12, and Example 12-2 shows a life retention rate higher by about 19% compared to Comparative Example 12. This shows that the life maintenance rate is improved as the specific surface area of powder is reduced through the fine powder control. The cathode active material produced by the crucible and crucible assembly according to the embodiments of the disclosure is as follows.

A cathode active material according to an aspect of the disclosure may include a core including a lithium transition metal oxide including W and B and a phosphorus-containing coating layer including a phosphorus-containing compound disposed on a surface of the core.

As B and W elements are introduced into the lithium transition metal oxide, structural stability is improved due to an increase in the ordering of Ni ions included in the transition metal oxide, and bonding strength between the transition metal and oxygen is increased, and thus, oxygen release is suppressed during charging and discharging of the lithium battery, and through this, a side reaction with the electrolyte is suppressed, thereby preventing the electrolyte from being exhausted.

In addition, because the lithium transition metal oxide includes a phosphorus-containing coating layer including a phosphorus-containing compound on a surface of a core including the lithium transition metal oxide, the phosphorus-containing compound preferentially reacts with HF derived from a binder and an electrolyte, and thus, side reactions with lithium transition metal oxide may be suppressed, and also the phosphorus-containing compound preferentially reacts with moisture present in the electrolyte solution to suppress side reactions with lithium transition metal oxide. As a result, the life characteristics are improved by suppressing deterioration of the lithium transition metal oxide due to side reactions.

According to one embodiment, among the cathode active materials, the lithium transition metal oxide may be represented by Formula 1 below:

$$Li_{1-x}A_xW_\alpha B_\beta M_{1-\alpha-\beta}O_{2-y}T_y \quad \text{[Formula 1]}$$

In Formula 1 above,

A is one or more elements selected from the group consisting of Na, K, Rb and Cs, T is one or more elements selected from the group consisting of S, F, and P, and M includes one or more elements selected from the group consisting of Ni, Co, Mn, Al, Mg, V, Ti, and Ca, here, $0<x\leq 0.01$, $0<y\leq 0.01$, $0<a\leq 0.01$, and $0<\beta\leq 0.01$.

In addition to including W and B, the lithium transition metal oxide, as represented by Formula 1, when a part of Li in the lithium transition metal oxide is substituted with a small amount of an alkali metal, structural stability of the lithium transition metal oxide is improved by suppressing structural deformation due to secession of Li ions during charging of the lithium battery.

In addition, as indicated by Formula 1, as some of oxygen in the lithium transition metal oxide is substituted with any one element of S, F, and P having a higher electronegativity than oxygen, transition metals may be preserved in the structure due to a higher bonding strength than bonding with oxygen, and a bonding strength between elements located in peroxygen lattice sites is increased, electron mobility is improved, and conductivity is improved. Therefore, high-rate cycle characteristics may also be improved.

In addition to including W and B, the lithium transition metal oxide, as represented by Formula 1, when a part of Li in the lithium transition metal oxide is substituted with a small amount of an alkali metal, Li Structural deformation due to secession of Li ions is suppressed when charging a lithium battery, thereby improving structural stability of the lithium transition metal oxide.

In addition, as indicated by Formula 1, as some of oxygen in the lithium transition metal oxide is substituted with any one element of S, F, and P having a higher electronegativity than oxygen, transition metals may be preserved in the structure due to a higher bonding strength than bonding with oxygen, and a bonding strength between elements located in peroxygen lattice sites is increased, electron mobility is improved, and conductivity is improved. Therefore, high-rate cycle characteristics may also be improved.

According to one embodiment, in Formula 1, A may be Na and T may be S.

According to one embodiment, in Formula 1, M may include M1, M2, and M3, wherein M1 is Ni, M2 and M3 are elements independently selected from Co, Mn, Al, Mg, V, Ti, and Ca, and a molar ratio of Ni in M may be 75 mol % or more.

According to another embodiment, in Formula 1, M includes M1, M2, and M3, wherein M1 is Ni, M2 is Co, and M3 is an element selected from Mn, Al, Mg, V, Ti, and Ca, and a molar ratio of Ni in M may be 75 mol % or more.

According to another embodiment, in Formula 1, M includes M1 and M2, wherein M1 is Ni, M2 is Co, and a molar ratio of Ni in M may be 75 mol % or more.

According to one embodiment, the lithium transition metal oxide may be represented by any one of Formulas 2 to 4:

$$Li_{1-x'}Na_{x'}W_{\alpha'}B_{\beta'}Ni_{\gamma'}Co_{\delta'}Mn_{\varepsilon'}O_{2-y'}S_{y'} \quad \text{[Formula 2]}$$

$$Li_{1-x''}Na_{x''}W_{\alpha''}B_{\beta''}Ni_{\gamma''}Co_{\delta''}Al_{\varepsilon''}O_{2-y''}S_{y''} \quad \text{[Formula 3]}$$

$$Li_{1-x'''}Na_{x'''}W_{\alpha'''}B_{\beta'''}Ni_{\gamma'''}Co_{\delta'''}O_{2-y'''}S_{y'''} \quad \text{[Formula 4]}$$

In Formula 2, $0<x'\leq 0.01$, $0<y'\leq 0.01$, $0<\alpha'\leq 0.01$, $0<\beta'\leq 0.01$, $0.48\leq y'<1$, $0<\delta'\leq 0.2$, $0<\varepsilon'\leq 0.3$, and $\alpha'+\beta'+\gamma'+\delta'+\varepsilon'=1$, In Formula 3, $0<x''\leq 0.01$, $0<y''\leq 0.01$, $0<\alpha''\leq 0.01$, $0<\beta''\leq 0.01$, $0.73\leq\gamma''<1$, $0<\delta''\leq 0.2$, $0<\varepsilon''\leq 0.05$, and $\alpha''+\beta''+\gamma''+\delta''+\varepsilon''=1$, and In Formula 4, $0<x'''\leq 0.01$, $0<y'''\leq 0.01$, $0<\alpha'''\leq 0.01$, $0<\beta'''\leq 0.01$, $0.78<\gamma'''<1$, and $0<\delta'''\leq 0.2$.

According to one embodiment, the lithium transition metal oxide may be a single particle. A single particle is a concept different from a secondary particle formed by aggregating a plurality of particles or a particle formed by aggregating a plurality of particles and coating the periphery of the agglomerate. Because the lithium transition metal oxide has a single particle shape, particle breakage may be avoided even at a high electrode density. Therefore, it is possible to implement a high energy density of the cathode active material. In addition, compared to a secondary particle in which a plurality of single particles are agglomerated, breakage during rolling is suppressed, high energy density may be achieved, and lifetime deterioration due to breakage of particles may be prevented.

According to one embodiment, the lithium transition metal oxide may have a single crystal. A single crystal is a term different from a single particle. A single particle refers to a particle formed of one particle regardless of the type and number of crystals therein, and a single crystal means having only one crystal in a particle. Because the core has a single crystal, structural stability is very high, and lithium-ion conduction is easier than that of a polycrystal, and thus, a high-speed charging characteristic is superior to that of a polycrystal active material.

According to one embodiment, the cathode active material is single crystal and single particle. Because the lithium transition metal oxide is formed in single crystals and single particles, structurally stable and high-density electrodes may be realized, and thus, a lithium secondary battery including the lithium transition metal oxide may have improved life characteristics and high energy density at the same time.

Cathode active materials represented by Formulas 2 to 4 have single crystals and single particles, and, in lithium transition metal oxide, some of Li is substituted with Na, some of the transition metals are substituted with W and B, and some of O is substituted with S, and thus, structural stability is remarkably improved, and long lifespan characteristics may be exhibited.

In the case of a cathode active material including general high-nickel lithium nickel cobalt manganese oxide, stabilization of unstable Ni ions is essential. By introducing W and B into some of the transition metal sites in the crystal, the cathode active material may achieve a charge balance as a whole, and thus, oxidation from Ni(II) ions to unstable Ni(III) or Ni(IV) ions may be prevented, and unstable Ni(III) or Ni(IV) may be reduced to Ni(II). On the other hand, a loss of conductivity caused by substituting a part of the transition metal with B and W, which are heterogeneous elements, was compensated by substituting a part of O with S, and by substituting a part of Li with Na, the decrease in conductivity of Li due to structural deformation during charging and discharging is also suppressed, thereby obtaining a structurally stable single crystal cathode active material with high capacity and long lifespan. Furthermore, in order to suppress a side reaction between the lithium transition metal oxide and the electrolyte or moisture, a phosphorus-containing coating layer including a phosphorus-containing compound, for example, $Li_3PO_4$ was introduced to a surface of the lithium transition metal oxide. The phosphorus-containing compound prevents side reactions with HF derived from an electrolyte solution or moisture present in the electrolyte solution, thereby ensuring high stability and long lifespan characteristics.

According to one embodiment, the core including the lithium transition metal compound may have a uniform composition over the entire range. As a result, it is possible to maintain a structurally stable structure even during charging and discharging, and has high-rate characteristics because the movement of lithium is not hindered.

According to one embodiment, the phosphorus-containing compound may be crystalline, amorphous, or a combination thereof.

For example, the phosphorus-containing compound may include crystalline $Li_3PO_4$ or an amorphous phosphorus-containing compound including lithium, phosphorus, and oxygen atoms.

According to one embodiment, a molar ratio of the phosphorus (P) element in the cathode active material may be 0.2 mol % or less of the total elements included in the cathode active material.

According to one embodiment, the phosphorus-containing compound may include a compound represented by Formula 5 below:

$Li_aP_bO_c$ [Formula 5]

Here, $0<a\leq3$, $0<b\leq1$, and $0<c\leq4$.

According to one embodiment, the coating layer may have a continuous coating layer on a surface of the core or an island-shaped coating layer partially present on the surface of the core. For example, the coating layer may have an island-shaped coating layer on the surface of the core.

According to one embodiment, the coating layer may have a thickness of several nanometers. For example, the coating layer may have a thickness in a range from about 1 nm to about 10 nm.

According to one embodiment, the cathode active material may have a peak at $2\theta=20°$ to $25°$ of an X-ray diffraction spectrum obtained by XRD analysis using CuKα rays.

For example, the cathode active material may have peaks at at least $2\theta=22.3°\pm0.5$, $23.0°\pm0.5$, and $24.8°\pm0.5$ in an X-ray diffraction spectrum obtained by XRD analysis using CuKα rays.

A peak at $2\theta=20°$ to $25°$ in the X-ray diffraction spectrum indicates the presence of $Li_3PO_4$. In addition, as will be described later, because the peak is observed in the coating layer of the cathode active material, it may be seen that the cathode active material does not include element P in the core.

The coating layer including the phosphorus-containing compound, for example, $Li_3PO_4$ is a reaction product of: a residual lithium compound generated in a process of synthesizing a Ni-based cathode active material, for example, $Li_2CO_3$ and LiOH and a phosphor-containing compound, and thus, the stability of a battery including the coating layer is improved by suppressing the generation of gas due to a side reaction between the residual lithium compound and the electrolyte. In addition, the coating layer including $Li_3PO_4$ has high ion conductivity and may promote the diffusion of lithium ions.

According to one embodiment, an average particle diameter ($D_{50}$) of the cathode active material may be in a range from 0.1 μm to 20 μm. For example, the average particle diameter ($D_{50}$) may be in a range from 0.1 μm to 15 μm, from 0.1 μm to 10 μm, from 1 μm to 20 μm, from 5 μm to 20 μm, from 1 μm to 15 μm, from 1 μm to 10 μm, from 5 μm to 15 μm, or from 5 μm to 10 μm. When the average particle diameter of the cathode active material falls within the above range, a desired energy density per volume may be realized. When the average particle diameter of the cathode active material exceeds 20 μm, a rapid decrease in charge/discharge capacity occurs, and when it is less than 0.1 μm, it is difficult to obtain a desired energy density per volume.

Hereinafter, a method of producing a cathode active material according to an embodiment will be described in detail.

A method of producing a cathode active material according to an embodiment includes obtaining a lithium transition metal oxide precursor by mixing a compound including a Li element, a compound including a W element, a compound including a B element, a compound including an A element, a compound including an M element, a compound including a T element, and a compound including a P element, and obtaining a cathode active material including a lithium transition metal oxide represented by Formula 1 by heat-treating the precursor, wherein the lithium transition metal oxide includes a phosphorus-containing coating layer on a surface thereof.

$Li_{1-x}A_xW_\alpha B_\beta M_{1-\alpha-\beta}O_{2-y}T_y$ [Formula 1]

In Formula 1,

A is one or more elements selected from the group consisting of Na, K, Rb and Cs, T is one or more elements selected from the group consisting of S, F and P, and M includes one or more elements selected from the group consisting of Ni, Co, Mn, Al, Mg, V, Ti, and Ca, here, $0<x\leq0.01$, $0<y\leq0.01$, $0<\alpha\leq0.01$, and $0<\beta\leq0.01$.

For a detailed description of Formula 1, refer to the foregoing.

The mixing operation includes mechanically mixing the specific element-including compounds. The mechanical mixing is carried out in a dry manner. The mechanical mixing is to form a uniform mixture by applying mechanical force to pulverize and mix the materials to be mixed. Mechanical mixing may be performed by using a mixing device such as a ball mill, planetary mill, stirred ball mill, vibrating mill, etc. that use chemically inert beads. At this time, in order to maximize the mixing effect, a small amount of an alcohol such as ethanol or a higher fatty acid such as stearic acid may be selectively added.

The mechanical mixing is performed under an oxidizing atmosphere, which prevents reduction of the transition metal in a transition metal source (e.g., Ni compound) to realize structural stability of the active material.

The lithium element-including compound may include lithium hydroxide, oxide, nitride, carbonate, or a combination thereof, but is not limited thereto. For example, the lithium precursor can be LiOH or $Li_2CO_3$.

The element A-including compound may include a hydroxide, oxide, nitride, carbonate, or a combination thereof of one or more elements selected from the group consisting of Na, K, Rb, and Cs, but is not limited thereto. For example, the element A-including compound may include NaOH, $Na_2CO_3$, KOH, $K_2CO_3$, RbOH, $Rb_2CO_3$, CsOH, or $Cs_2CO_3$.

The W precursor may include a hydroxide, oxide, nitride, carbonate, or a combination thereof of W, but is not limited thereto. For example, the W precursor may be $W(OH)_6$, $WO_3$, or a combination thereof.

The element B-including compound may include a hydroxide, oxide, nitride, carbonate, or a combination thereof of B, but is not limited thereto. For example, the element B-including compound may be $B(OH)_3$, $B_2O_3$, or a combination thereof.

The element M-including compound may include a hydroxide, oxide, nitride, carbonate, or a combination thereof of one or more elements selected from Ni, Co, Mn, Al, Mg, V, Ti, and Ca, but is not limited thereto.

The element T-including compound may include a hydroxide, oxide, nitride, carbonate, ammonium, or a combination thereof of one or more elements selected from S, F, and P, but is not limited thereto. For example, the element T-including compound may be $(NH_4)_2S$.

The element P-including compound may include all compounds capable of providing element P. For example, the element P-including compound may be $(NH_4)_2HPO_4$.

After the mixing operation, a heat treatment operation may be included. The heat treatment may include a first heat treatment and a second heat treatment. The first heat treatment and the second heat treatment may be performed continuously or may have a rest period after the first heat treatment. In addition, the first heat treatment and the second heat treatment may be performed in the same chamber or in different chambers.

A heat treatment temperature in the first heat treatment may be higher than a heat treatment temperature in the second heat treatment.

The first heat treatment may be performed at a heat treatment temperature in a range from 800° C. to 1200° C. The heat treatment temperature may be, for example, in a range from 850° C. to 1200° C., from 860° C. to 1200° C., from 870° C. to 1200° C., from 880° C. to 1200° C., from 890° C. to 1200° C., or from 900° C. to 1200° C., but is limited thereto, and all ranges formed by selecting two arbitrary points within the above range are included.

The second heat treatment may be performed at a heat treatment temperature in a range from 700° C. to 800° C. The heat treatment temperature may be in a range from 710° C. to 800° C., from 720° C. to 800° C., from 730° C. to 800° C., from 740° C. to 800° C., from 750° C. to 800° C., from 700° C. to 780° C., from 700° C. to 760° C., from 700° C. to 750° C., or from 700° C. to 730° C., but is not limited thereto, and all ranges formed by selecting two arbitrary points within the above range are included.

According to one embodiment, the heat treatment time in the first heat treatment may be less than the heat treatment time in the second heat treatment.

For example, the heat treatment time in the first heat treatment may be in a range from 3 hours to 5 hours, from 4 hours to 5 hours, or from 3 hours to 4 hours, but is not limited thereto, and all ranges formed by selecting two arbitrary points within the above range are included.

For example, the heat treatment time in the second heat treatment may be in a range from 10 hours to 20 hours or from 10 hours to 15 hours, but is not limited thereto, and all ranges formed by selecting two arbitrary points within the above range are included.

The first heat treatment may include heat treatment at a heat treatment temperature in a range from 800° C. to 1200° C. for 3 hours to 5 hours.

The second heat treatment may include heat treatment at a heat treatment temperature in a range from 700° C. to 800° C. for 10 hours to 20 hours.

In the first heat treatment, the lithium transition metal oxide forms a layered cathode active material and simultaneously induces growth of particles to form single crystals. In the first heat treatment, it is thought that, as each primary particle in the secondary particle-shaped lithium transition metal oxide grows rapidly and may not withstand the inter-particle stress, the interior of the primary particles is exposed and fused together, thereby forming a single crystal cathode active material for a secondary battery. The second heat treatment increases the crystallinity of a layer structure generated in the first heat treatment by performing a heat treatment at a lower temperature for a longer time than the first heat treatment. A single phase, single crystal, single particle nickel-based cathode active material may be obtained through the first and second heat treatments.

According to one embodiment, the lithium transition metal oxide produced by the producing method is a single crystal or a single particle, and the single crystal may have a layered structure. In addition, an average particle diameter of the lithium transition metal oxide may be in a range from about 0.1 μm to about 20 μm.

In addition, in the cathode active material prepared by the method of producing a cathode active material, elements W and B are substituted for Ni in the structure, and element T, for example, element S is substituted in the position of O. In addition, when element A is substituted in the position of Li, oxidation of existing $Ni^{2+}$ is suppressed and also reduction of existing unstable $Ni^{3+}$ ions to $Ni^{2+}$ ions is induced. Reduced $Ni^{2+}$ ions and $Li^{+}$ ions have similar ionic radii, and thus, promote Li/Ni disorder, which partially changes the oxygen lattice structure in the core. Because the oxygen lattice structure is partially changed, the element P occupies a tetrahedral position in the structure and does not form a $PO_4$ structure, and thus, the element P may not penetrate into the tetrahedral position in the core and exists in the form of a phosphorus-containing compound, for example, $Li_3PO_4$ on a surface of the cathode active material.

In addition, the cathode active material produced by the method includes a coating layer including a phosphorus-containing compound on a surface thereof, and thus, a cathode active material in which the amount of residual lithium and the amount of unstable Ni ions are reduced at the same time may be obtained, and accordingly, a lithium secondary employing such a cathode active material may have high energy density and long lifespan.

According to another embodiment, a cathode including the cathode active material described above is provided.

According to another embodiment, there is provided a lithium secondary battery including the cathode; anode; and an electrolyte.

The cathode and the lithium secondary battery including the same may be manufactured in the following manner.

First, a cathode is prepared.

For example, a cathode active material composition in which the aforementioned cathode active material, a conductive material, a binder, and solvent are mixed is prepared. The cathode active material composition is directly coated on a metal current collector to prepare a cathode plate. Alternatively, after casting the cathode active material composition on a separate support, a cathode plate may be manufactured by laminating a film peeled from the support on a metal current collector. The forms of the cathode is not limited to the forms listed above and may have forms other than the above forms.

Examples of the conductive material may include graphite such as natural graphite and artificial graphite; carbon black; conductive tubes such as carbon nanotubes; conductive whiskers such as fluorocarbon, zinc oxide, and potassium titanate; conductive metal oxides such as titanium oxide; and the like, but are not limited thereto, and any one that may be used as a conductive material in the art may be used.

As the binder, vinylidene fluoride/hexafluoropropylene copolymer, polyvinylidene fluoride (PVDF), polyacrylonitrile, polymethyl methacrylate, polytetrafluoroethylene, a mixture thereof, a metal salt, or styrene butadiene rubber-based polymers, and the like may be used, but are not limited thereto, and any material that may be used as a binder in the art may be used. As another example of the binder, lithium salt, sodium salt, calcium salt, or Na salt of the aforementioned polymer may be used.

As the solvent, N-methylpyrrolidone, acetone, or water may be used, but is not limited thereto, and any solvent that may be used in the art may be used.

The content of the cathode active material, conductive material, binder, and solvent is at a level commonly used in a lithium battery. At least one of the conductive material, the binder, and the solvent may be omitted according to the use and configuration of the lithium battery.

Next, the anode is prepared.

For example, an anode active material composition is prepared by mixing an anode active material, a conductive material, a binder, and a solvent. An anode plate is prepared by directly coating and drying the anode active material composition on a metal current collector having a thickness in a range from about 3 μm to about 500 μm. Alternatively, after the anode active material composition is cast on a separate support, a film separated from the support is laminated on a metal current collector to manufacture an anode plate.

An anode current collector is not particularly limited as long as it does not cause chemical change in the battery and has conductivity. For example, copper, nickel, or copper surface-treated with carbon may be used as the anode plate.

The anode active material may be any material that may be used as an anode active material for a lithium battery in the art. For example, the anode active material may include at least one selected from the group consisting of lithium metal, a metal alloyable with lithium, a transition metal oxide, a non-transition metal oxide, and a carbon-based material.

For example, the metal alloyable with lithium may include Si, Sn, Al, Ge, Pb, Bi, Sb Si—Y alloy (wherein Y is an alkali metal, an alkaline earth metal, a group 13 element, a group 14 element, a transition metal, a rare earth element, or a combination thereof, but not Si), a Sn—Y alloy (wherein Y is an alkali metal, an alkaline earth metal, a Group 13 element, a Group 14 element, a transition metal, a rare earth element, or a combination thereof, but not Sn), and the like. The element Y may include Mg, Ca, Sr, Ba, Ra, Sc, Y, Ti, Zr, Hf, Rf, V, Nb, Ta, Db, Cr, Mo, W, Sg, Tc, Re, Bh, Fe, Pb, Ru, Os, Hs, Rh, Ir, Pd, Pt, Cu, Ag, Au, Zn, Cd, B, Al, Ga, Sn, In, Ti, Ge, P, As, Sb, Bi, S, Se, or Te.

For example, the transition metal oxide may be lithium titanium oxide, vanadium oxide, or lithium vanadium oxide.

For example, the non-transition metal oxide may be $SnO_2$, $SiOx(0<x<2)$, etc.

The carbon-based material may be crystalline carbon, amorphous carbon, or a mixture thereof. The crystalline carbon may be graphite such as amorphous, plate, flake, spherical or fibrous natural graphite or graphite such as artificial graphite, and the amorphous carbon may be soft carbon (low-temperature calcined carbon) or hard carbon carbon), mesophase pitch carbide, calcined coke, and the like.

In the anode active material composition, the same conductive material, binder, and solvent as in the cathode active material composition may be used.

The content of the anode active material, conductive material, binder, and solvent is at a level commonly used in a lithium battery. At least one of the conductive material, the binder, and the solvent may be omitted according to the use and configuration of the lithium battery.

Next, a separator to be inserted between the cathode and the anode is prepared.

Any of the separators commonly used in lithium batteries may be used. An electrolyte having low resistance to ion migration and excellent ability to absorb the electrolyte solution may be used. The separator may be a single film or a multilayer film, for example, one selected from glass fiber, polyester, Teflon, polyethylene, polypropylene, polyvinylidene fluoride, polytetrafluoroethylene (PTFE), or a combination thereof, and may be in the form of non-woven fabric or woven fabric. In addition, a mixed multilayer film such as a polyethylene/polypropylene two-layer separator, a polyethylene/polypropylene/polyethylene three-layer separator, a polypropylene/polyethylene/polypropylene three-layer separator, or the like may be used. For example, a winding separator such as polyethylene or polypropylene may be used in a lithium ion battery, and a separator having excellent organic electrolyte solution impregnating ability may be used in a lithium ion polymer battery. For example, the separator may be manufactured according to the following method.

A separator composition is prepared by mixing a polymer resin, a filler, and a solvent. A separator may be formed by directly coating and drying the separator composition on an electrode. Alternatively, after the separator composition is cast and dried on a support, a separator film separated from the support may be laminated on an electrode to form a separator.

The polymer resin used to manufacture the separator is not particularly limited, and any material that is used for the binder of the electrode plate may be used. For example, vinylidene fluoride/hexafluoropropylene copolymer, polyvinylidene fluoride (PVDF), polyacrylonitrile, polymethyl methacrylate, or mixtures thereof may be used.

Next, an electrolyte is prepared.

For example, the electrolyte may be an organic electrolyte solution. Also, the electrolyte may be solid. For example, the electrolyte may be boron oxide, lithium oxynitride, etc., but is not limited thereto, and any solid electrolyte that may be used in the art may be used. The solid electrolyte may be formed on the anode by using a method such as sputtering.

For example, the organic electrolyte solution may be prepared by dissolving a lithium salt in an organic solvent.

The organic solvent may be any solvent that may be used as an organic solvent in the art. For example, the organic solvent may include: cyclic carbonates, such as propylene carbonate, ethylene carbonate, fluoroethylene carbonate, butylene carbonate, and vinylene carbonate; chain carbonates such as dimethyl carbonate, diethyl carbonate, methyl ethyl carbonate, methyl propyl carbonate, ethyl propyl carbonate, methyl isopropyl carbonate, dipropyl carbonate, and dibutyl carbonate; esters such as methyl acetate, ethyl acetate, propyl acetate, methyl propionate, ethyl propionate, and γ-butyrolactone; ethers such as 1,2-dimethoxyethane, 1,2-diethoxyethane, tetrahydrofuran, 1,2-dioxane, and 2-methyltetrahydrofuran; nitriles such as acetonitrile; amides such as dimethylformamide; and the like. Each of these materials may be used alone or in combination of a plurality of them. For example, a solvent in which a cyclic carbonate and a chain carbonate are mixed may be used.

In addition, a gel polymer electrolyte in which an electrolyte solution is impregnated into a polymer electrolyte such as polyethylene oxide or polyacrylonitrile, or an inorganic solid electrolyte such as LiI, $Li_3N$, $Li_xGe_yPZS_\alpha$, $Li_xGe_yP_zS_\alpha X_\delta$(X═F, Cl, Br) may be used.

The lithium salt may also be used any lithium salt that may be used as a lithium salt in the art. For example, the lithium salt may include $LiPF_6$, $LiBF_4$, $LiSbF_6$, $LiAsF_6$, $LiClO_4$, $LiCF_3SO_3$, $Li(CF_3SO_2)_2N$, $LiC_4F_9SO_3$, $LiAlO_2$, $LiAlCl_4$, $LiN(C_xF_{2x+1}SO_2)(C_yF_{2y+1}SO_2)$ (where x and y are natural numbers), LiCl, LiI or mixtures thereof, and the like.

The cathode active material according to one embodiment may have excellent stability even when a fluorine-containing electrolyte is used due to the presence of a coating layer including a phosphorus-containing compound.

Figure 15:
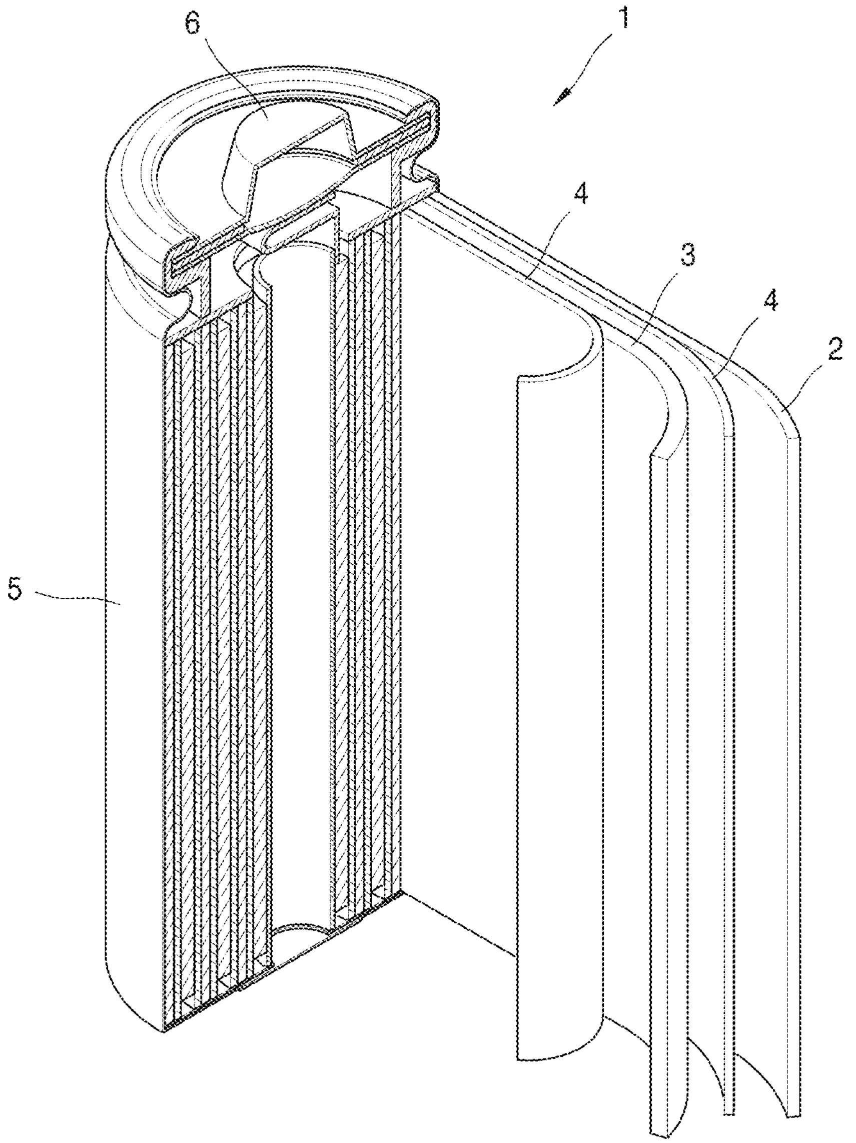
FIG. 15 is a schematic diagram of a lithium battery according to an embodiment.

FIG. 15 is a schematic diagram of a lithium battery 1 according to an embodiment.

As shown in FIG. 15, the lithium battery 1 includes an anode 3, a cathode 2, and a separator 4. The cathode 3, the anode 2 and the separator 4 are wound or folded and accommodated in a battery case 5. Subsequently, an organic electrolyte solution is injected into the battery case 5 and sealed with a cap assembly 6 to complete the lithium battery 1. The battery case 5 may be a cylindrical shape, a prismatic shape, a pouch shape, a coin shape, or a thin film shape. For example, the lithium battery 1 may be a thin film battery. The lithium battery 1 may be a lithium-ion battery.

A battery structure may be formed by placing a separator between the cathode and the anode. After the battery structure is stacked in a bi-cell structure, impregnated with an organic electrolyte, and the resultant product is accommodated in a pouch and sealed, a lithium-ion polymer battery is completed.

In addition, a battery pack is formed by stacking a plurality of the battery structures, and such a battery pack may be used in all devices requiring high capacity and high output. For example, the battery pack may be used for laptops, smartphones, electric vehicles, and the like.

In addition, because the lithium battery has excellent lifespan characteristics and high-rate characteristics, it can be used in electric vehicles (EVs). For example, the lithium battery may be used for hybrid vehicles such as plug-in hybrid electric vehicles (PHEVs). In addition, the lithium battery may be used in fields requiring large amounts of power storage. For example, the lithium battery may be used for electric bicycles, power tools, power storage systems, and the like.

Figure 16:
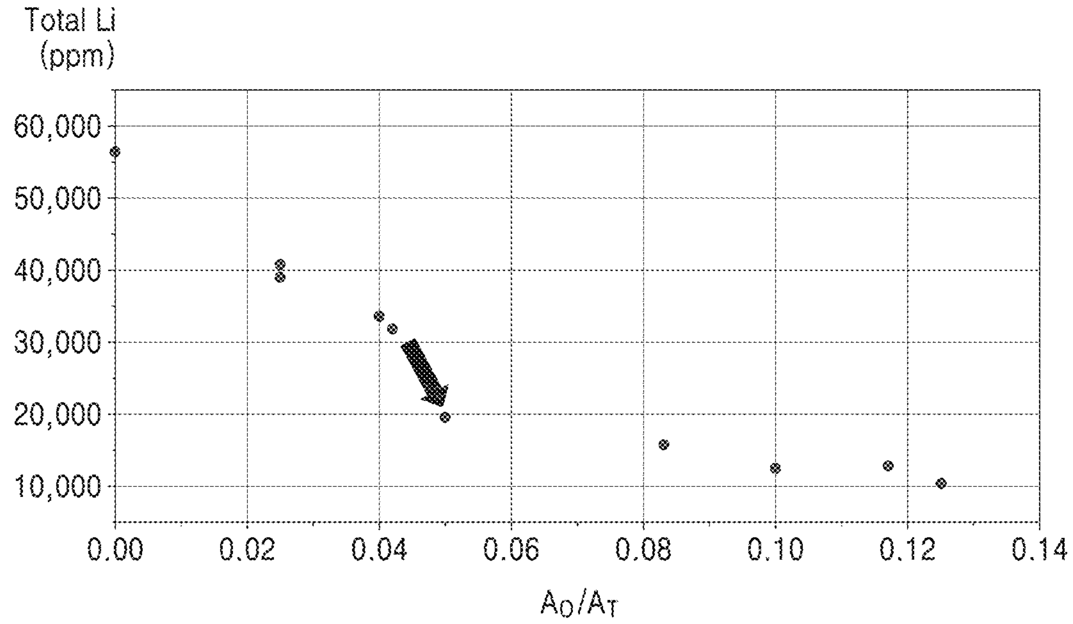
FIG. 16 is a graph showing an amount of a residual lithium compound in the cathode active materials of Examples 1 to 5 and Comparative Examples 1 to 5.

FIG. 16 is a graph showing the amount of residual lithium compound in the cathode active materials of Examples 1 to 5 and Comparative Examples 1 to 5.

In Examples 1 to 5 and Comparative Examples 1 to 5, cathode active materials were synthesized according to the following method. First, 2,000 g of $Ni_{0.8}Co_{0.1}Mn_{0.1}(OH)_2$, 836 g of $Li_2CO_3$, 6 g of $(NH_4)_2HPO_4$, 60 g of $WO_3$, 9 g of NaOH, and 15 g of $(NH_4)_2S$ are mechanically mixed for about 15 minutes. The mixed powder was weighed and placed into a crucible of each Example and Comparative Example, and the cathode active material was obtained through sintering at 1,000 00 for 4 hours and at 700 00 for 10 hours.

TABLE 12

| | W1 (mm) | H1 (mm) | W2 (mm) | H2 (mm) | $A_O/A_T$ | $Li_2CO_3$ (ppm) | LiOH (ppm) | Total Li (ppm) |
|---|---|---|---|---|---|---|---|---|
| Comparative Example 1 | 300 | 80 | 0 | 0 | 0 | 45,250 | 11,150 | 56,400 |
| Comparative Example 2 | 300 | 80 | 60 | 10 | 0.025 | 30,110 | 8,940 | 39,050 |
| Comparative Example 3 | 300 | 80 | 100 | 10 | 0.042 | 24,360 | 7,490 | 31,850 |
| Comparative Example 4 | 300 | 80 | 120 | 5 | 0.025 | 31,540 | 9,270 | 40,810 |
| Comparative Example 5 | 300 | 80 | 120 | 8 | 0.04 | 25,110 | 8,460 | 33,570 |
| Example 1 | 300 | 80 | 120 | 10 | 0.05 | 13,220 | 6,410 | 19,630 |
| Example 2 | 300 | 80 | 200 | 10 | 0.083 | 10,580 | 5,250 | 15,830 |
| Example 3 | 300 | 80 | 280 | 10 | 0.117 | 8,420 | 4,470 | 12,890 |
| Example 4 | 300 | 80 | 120 | 20 | 0.1 | 7,730 | 4,860 | 12,590 |
| Example 5 | 300 | 80 | 120 | 25 | 0.125 | 6,540 | 3,950 | 10,490 |

Referring to Table 12 and FIG. 16, the cathode active materials prepared by the producing methods of Comparative Examples 1 to 5 show a high amount of residual lithium of 56,400 ppm to 33,570 ppm. On the other hand, it may be confirmed that the 5 total amount of residual lithium compounds ($Li_2CO_3$ and LiOH) in the cathode active materials prepared by the producing methods of Examples 1 to 5 are rapidly decreased to 20,000 ppm or less. In the case of Comparative Example 3 having a ratio ($A_O/A_T$) of 0.042, the total amount of residual lithium compounds was 31,850 ppm, and in Comparative Example 5 having a ratio ($A_O/A_T$) of 0.04, the total amount of residual lithium compounds reached 33,570 ppm. In Example 1 having a ratio ($A_O/A_T$) of 0.05, it may be confirmed that the amount of the residual lithium compound is 19,630 ppm or less, which is reduced by 10,000 ppm or more compared to Comparative Examples.

The amount of residual lithium decreases rapidly until a ratio of an open area of an incision groove to a sidewall area of one crucible reaches 0.05. After that, even if the ratio of the open area to the sidewall area increases, the amount of residual lithium compound decreases very gently.

The residual lithium compound causes a side reaction with the electrolyte to generate gas, which is an important factor in reducing the stability of the battery. Therefore, when the ratio of the open area of the incision groove to the area of the sidewall of one crucible is 0.05 or more, the produced cathode active material has a residual lithium compound of 20,000 ppm or less, and thus, the stability of a battery may be greatly increased.

In this way, the disclosure has been described with reference to the embodiments shown in the drawings, but this is only examples, and those skilled in the art will understand that various modifications and equivalent other embodiments are possible therefrom. Therefore, the true technical scope of protection of the present disclosure should be determined by the technical spirit of the appended claims.

The invention claimed is:

1. A crucible assembly for producing a cathode active material, the crucible assembly comprising:

a first crucible having an open top and an inner space; and a second crucible disposed under the first crucible and having an incision groove with an open area at an upper portion of each sidewall, wherein the open area of the incision groove satisfies the equation below:

$$\frac{A_O}{A_T} \geq 0.05 \quad \text{[Equation]}$$

wherein $A_O$ is the open area of the incision groove, and $A_T$ is a sidewall area of the second crucible, wherein at least one of the first crucible and the second crucible includes a compound represented by the following Formula:

$$xAl_2O_3 \cdot yMgO \cdot zSiO_2,$$

where (0.9<x<1, 0<y<0.1, 0<z<0.1, and x+y+z=1).

2. The crucible assembly of claim 1, wherein the incision groove is disposed above a center of a height of the second crucible.

3. The crucible assembly of claim 1, wherein
the second crucible has opposite sidewalls disposed to face each other, and
incision grooves on the opposite sidewalls are disposed to face each other.

4. The crucible assembly of claim 1, wherein
the second crucible is provided in a plurality, and
the plurality of the second crucibles are stacked under the first crucible in a height direction.

5. A crucible for producing a cathode active material, the crucible having an inner space defined by a bottom and sidewalls and comprising:
an incision groove in an upper portion of each of the sidewalls and having an open area, wherein
the open area of the incision groove satisfies Equation below:

$$\frac{A_o}{A_T} \geq 0.05 \qquad \text{[Equation]}$$

wherein $A_O$ is the open area of the incision groove, and $A_T$ is a sidewall area of the crucible,
wherein the crucible includes a compound represented by the following Formula:

$$xAl_2O_3 \cdot yMgO \cdot zSiO_2,$$

where ($0.9<x<1$, $0<y<0.1$, $0<z<0.1$, and $x+y+z=1$).

* * * * *